US009893267B2

(12) United States Patent
Kubota et al.

(10) Patent No.: US 9,893,267 B2
(45) Date of Patent: *Feb. 13, 2018

(54) PIEZOELECTRIC MATERIAL, PIEZOELECTRIC DEVICE, AND ELECTRONIC APPARATUS

(71) Applicant: CANON KABUSHIKI KAISHA, Tokyo (JP)

(72) Inventors: Makoto Kubota, Yokohama (JP); Shunsuke Murakami, Kawasaki (JP); Takayuki Watanabe, Yokohama (JP); Miki Ueda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 156 days.

This patent is subject to a terminal disclaimer.

(21) Appl. No.: 14/763,982

(22) PCT Filed: Jan. 24, 2014

(86) PCT No.: PCT/JP2014/052189
§ 371 (c)(1),
(2) Date: Jul. 28, 2015

(87) PCT Pub. No.: WO2014/119706
PCT Pub. Date: Aug. 7, 2014

(65) Prior Publication Data
US 2015/0364672 A1 Dec. 17, 2015

(30) Foreign Application Priority Data
Jan. 29, 2013 (JP) ................. 2013-014612

(51) Int. Cl.
H01L 41/187 (2006.01)
H01L 41/43 (2013.01)
C04B 35/495 (2006.01)
B41J 2/14 (2006.01)
H02N 2/10 (2006.01)
H02N 2/16 (2006.01)
(Continued)

(52) U.S. Cl.
CPC .......... H01L 41/18 (2013.01); B06B 1/0644 (2013.01); B08B 7/02 (2013.01); B32B 18/00 (2013.01); B41J 2/14201 (2013.01); B41J 2/14233 (2013.01); C01G 49/0036 (2013.01); C04B 35/495 (2013.01); C04B 35/62675 (2013.01); C04B 35/62685 (2013.01); G02B 27/0006 (2013.01); H01L 41/0471 (2013.01); H01L 41/0477 (2013.01); H01L 41/08 (2013.01); H01L 41/083 (2013.01); H01L 41/09 (2013.01); H01L 41/0973 (2013.01); H01L 41/183 (2013.01); H01L 41/1871 (2013.01); H01L 41/1873 (2013.01); H01L 41/1878 (2013.01); H01L 41/43 (2013.01); H02N 2/001 (2013.01); H02N 2/106 (2013.01); H02N 2/163 (2013.01); H04N 5/2254 (2013.01); C01P 2002/34 (2013.01); C01P 2002/50 (2013.01); C04B 2235/3201 (2013.01); C04B 2235/3215 (2013.01); C04B 2235/3236 (2013.01); C04B 2235/3255 (2013.01); C04B 2235/3272 (2013.01); C04B 2235/3274 (2013.01); C04B 2235/3281 (2013.01); C04B 2235/3298 (2013.01); C04B 2235/768 (2013.01); C04B 2235/77 (2013.01); C04B 2235/785 (2013.01); C04B 2235/786 (2013.01); C04B 2235/81 (2013.01); C04B 2235/96 (2013.01); C04B 2237/345 (2013.01); C04B 2237/704 (2013.01)

(58) Field of Classification Search
CPC . H01L 41/18; H01L 41/1871; H01L 41/1872; H01L 41/1878; C04B 35/495; C04B 35/62675; C04B 35/62685; C01G 49/0036
See application file for complete search history.

(56) References Cited

U.S. PATENT DOCUMENTS

2009/0243439 A1   10/2009   Furukawa et al.
2013/0335488 A1*  12/2013   Watanabe ............ B41J 2/14233
                                                       347/70

FOREIGN PATENT DOCUMENTS

JP   2009-227535 A   10/2009
WO   2012/118213 A1   9/2012
(Continued)

OTHER PUBLICATIONS

Zeng et al., "Ferroelectric and Piezoelectric Properties of Na1—xBaxNb1—xTixO3 Ceramics", Journal of the American Society, 2006, vol. 89, pp. 2828-2832.
Kozono et al., "Determination of ultratrace impurity elements in high purity niobium materials by on-line matrix separation and direct injection/inductively coupled plasma mass spectrometry", ScienceDirect, vol. 72, No. 5, Jul. 4, 2007, pp. 1791-1799.

(Continued)

Primary Examiner — C Melissa Koslow
(74) Attorney, Agent, or Firm — Canon U.S.A. Inc., IP Division

(57) ABSTRACT

A piezoelectric material that has good insulating properties and piezoelectricity and is free of lead and potassium and a piezoelectric element that uses the piezoelectric material are provided. The piezoelectric material contains copper and a perovskite-type metal oxide represented by general formula (1): $(1-x)\{(Na_yBa_{1-z})(Nb_zTi_{1-z})O_3\}$-$xBiFeO_3$ (where $0<x\leq0.015$, $0.80\leq y\leq 0.95$, and $0.85\leq z\leq 0.95$). In the piezoelectric material, 0.04 mol % or more and 2.00 mol % or less of Cu is contained relative to 1 mol of the perovskite-type metal oxide. Also provided is a piezoelectric element that includes a first electrode, a piezoelectric material, and a second electrode, in which the piezoelectric material described above is used as the piezoelectric material.

23 Claims, 14 Drawing Sheets

(51) Int. Cl.

| | |
|---|---|
| *H01L 41/18* | (2006.01) |
| *H01L 41/09* | (2006.01) |
| *C04B 35/626* | (2006.01) |
| *C01G 49/00* | (2006.01) |
| *B32B 18/00* | (2006.01) |
| *H01L 41/083* | (2006.01) |
| *B06B 1/06* | (2006.01) |
| *B08B 7/02* | (2006.01) |
| *G02B 27/00* | (2006.01) |
| *H01L 41/047* | (2006.01) |
| *H01L 41/08* | (2006.01) |
| *H02N 2/00* | (2006.01) |
| *H04N 5/225* | (2006.01) |

(56) References Cited

FOREIGN PATENT DOCUMENTS

| | | | |
|---|---|---|---|
| WO | WO 2012/118213 | * | 9/2012 |
| WO | 2013/005701 A1 | | 1/2013 |
| WO | 2013/062120 A1 | | 5/2013 |
| WO | WO 2013/062120 | * | 5/2013 |

OTHER PUBLICATIONS

Zhou et al., "Addition of small amounts of BiFeO3 to (Li,K,Na)(Nb,Ta)O3 lead-free ceramics: Influence on phase structure, microstructure and piezoelectric properties", SciVerse ScienceDirect, vol. 32, No. 13, May 10, 2012, pp. 3575-3582.

* cited by examiner

PIEZOELECTRIC MATERIAL, PIEZOELECTRIC DEVICE, AND ELECTRONIC APPARATUS

TECHNICAL FIELD

The present invention generally relates to piezoelectric materials and, in particular, to a lead-free piezoelectric material. The present invention also relates to a piezoelectric element, a multilayered piezoelectric element, a liquid discharge head, a liquid discharge apparatus, an ultrasonic motor, an optical apparatus, a vibrating apparatus, a dust removing device, an image-capturing apparatus, and an electronic apparatus that use the piezoelectric material.

BACKGROUND ART $ABO_3$ perovskite-type metal oxides such as lead zirconate titanate (hereinafter also referred to as "PZT") are commonly used as piezoelectric ceramics. Since PZT contains lead as the A site element, its impact on the environment has been a concern. Accordingly, piezoelectric ceramics composed of lead-free perovskite-type metal oxides are in demand.

NPL 1 reports that dissolving a small quantity of barium titanate in an anti-ferroelectric material sodium niobate gives ferroelectric sodium niobate. NPL 1 also discloses remanent polarization, coercive electric field, piezoelectric constant, and electromechanical coupling coefficient of sodium niobate having a barium titanate concentration of 5% to 20% and sintered at a temperature of 1200° C. to 1280° C. The material disclosed in NPL 1 is not only free of lead but also free of potassium which generates poor sinterability and causes low moisture resistance. The Curie temperature of the material disclosed in NPL 1 is higher than the Curie temperature (110° C. to 120° C.) of barium titanate, which is a representative example of lead-free piezoelectric materials. NPL 1 also discloses that the Curie temperature of the composition $(Na_{0.9}Ba_{0.1})(Nb_{0.9}Ti_{0.1})O_3$ with which the highest piezoelectric constant $d_{33}=143$ pC/N is yielded is 230° C.

PTL 1 discloses that adding cobalt to a piezoelectric ceramic which is a solid solution of sodium niobate and barium titanate improves the piezoelectric constant. PTL 1 also discloses that some samples of the piezoelectric material were difficult to polarize due to a low insulating property of $10^6 \Omega$ or less.

CITATION LIST

Patent Literature

PTL 1: Japanese Patent Laid-Open No. 2009-227535

Non Patent Literature

NPL 1: "J. T. Zeng et al., Journal of the American Ceramic Society" 2006, vol. 89, pp. 2828 to 2832

SUMMARY OF INVENTION

Technical Problem

According to the related art, a piezoelectric material obtained by dissolving barium titanate in sodium niobate (hereinafter this piezoelectric material is referred to as NN-BT) is to be sintered at a high temperature of 1200° C. to 1280° C. in order to improve the piezoelectric constant and expensive and possibly toxic cobalt has been used. Moreover, the insulation resistance of NN-BT doped with cobalt has not been always high.

The present invention provides a piezoelectric material that is free of lead and potassium, does not use cobalt, and has a high Curie temperature and good insulating properties and piezoelectricity. A piezoelectric element, a multilayered piezoelectric element, a liquid discharge head, a liquid discharge apparatus, an ultrasonic motor, an optical apparatus, a vibrating apparatus, a dust removing device, an image-capturing apparatus, and an electronic apparatus that use the piezoelectric material are also provided.

Solution to Problem

A piezoelectric material according to an embodiment of the present invention that addresses the problem described above includes copper and a perovskite-type metal oxide represented by general formula (1)

$$(1-x)\{(Na_yBa_{1-y})(Nb_zTi_{1-z})O_3\}\text{-}xBiFeO_3 \text{ (where}$$
$$0 < x \leq 0.015, \ 0.80 \leq y \leq 0.95, \text{ and } 0.85 \leq z \leq 0.95) \quad (1)$$

in which 0.04 mol % or more and 2.00 mol % or less of Cu is contained relative to 1 mol of the perovskite-type metal oxide.

A piezoelectric element according to an embodiment of the invention includes at least a first electrode, a piezoelectric material portion, and a second electrode. The piezoelectric material portion includes the piezoelectric material described above.

A multilayered piezoelectric element according to an embodiment of the invention includes two or more piezoelectric material layers and one or more electrode layers that include one or more internal electrodes. The piezoelectric material layers and the electrode layers are alternately stacked and the piezoelectric material layers include the piezoelectric material described above.

A liquid discharge head according to an embodiment of the invention includes a liquid chamber that includes a vibrating unit that includes the piezoelectric element or the multilayered piezoelectric element described above, and a discharge port communicating with the liquid chamber.

A liquid discharge apparatus according to an embodiment of the invention includes a stage configured to receive an object and the liquid discharge head described above.

An ultrasonic motor according to an embodiment of the invention includes a vibrating body that includes the piezoelectric element or the multilayered piezoelectric element described above, and a moving body configured to come into contact with the vibrating body.

An optical apparatus according to an embodiment of the invention includes a drive unit that includes the ultrasonic motor described above.

A vibrating apparatus according to an embodiment of the invention includes a vibrating body including a diaphragm and the piezoelectric element or the multilayered piezoelectric element described above disposed on the diaphragm.

A dust removing device according to an embodiment of the invention includes a vibrating unit that includes the vibrating apparatus described above.

An image-capturing apparatus according to an embodiment of the invention includes the dust removing device described above and an image-capturing element unit. The diaphragm of the dust removing device is disposed on a light-receiving-surface side of the image-capturing element unit.

An electronic apparatus according to an embodiment of the invention includes a piezoelectric acoustic part that includes the piezoelectric element or the multilayered piezoelectric element described above.

Advantageous Effects of Invention

According to the present invention, a piezoelectric material that is free of lead and potassium and has a high Curie temperature and good insulating properties and piezoelectricity can be provided. A piezoelectric element, a multilayered piezoelectric element, a liquid discharge head, a liquid discharge apparatus, an ultrasonic motor, an optical apparatus, a vibrating apparatus, a dust removing device, an image-capturing apparatus, and an electronic apparatus that use the piezoelectric material can also be provided.

The piezoelectric material of the present invention is lead free and has low impact on the environment. Moreover, since no potassium is contained, sinterability and moisture resistance are also high.

DESCRIPTION OF EMBODIMENTS

Figure 1:
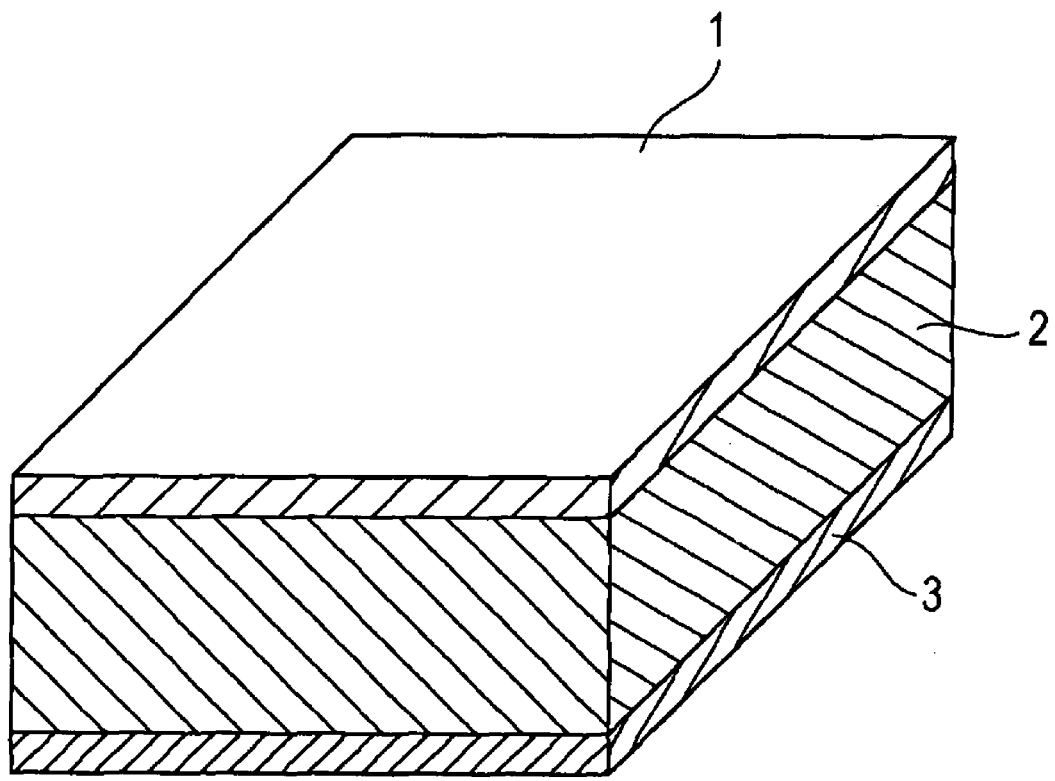
FIG. 1 is a schematic diagram of a piezoelectric element according to one embodiment of the invention.

Embodiments of the invention will now be described.

The present invention provides a lead-free piezoelectric material that is based on a piezoelectric material (NN-BT) obtained by dissolving barium titanate in sodium niobate and has good piezoelectricity and insulating properties. The piezoelectric material can be used in a variety of usages such as capacitors, memories, and sensors by utilizing its dielectric properties.

The piezoelectric material according to an embodiment of the invention contains Cu and a perovskite-type metal oxide represented by general formula (1):

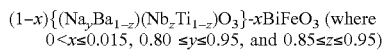

$(1-x)\{(Na_yBa_{1-z})(Nb_zTi_{1-z})O_3\}-xBiFeO_3$ (where $0 < x \leq 0.015$, $0.80 \leq y \leq 0.95$, and $0.85 \leq z \leq 0.95$)

The Cu content relative to 1 mol of the perovskite-type metal oxide is 0.04 mol % or more and 2.00 mol % or less.

For the purposes of the present invention, a "perovskite-type metal oxide" refers to a metal oxide that has a perovskite-type structure that is ideally a cubic structure as defined by Iwanami Rikagaku Jiten, 5th edition (published Feb. 20, 1998 by Iwanami Shoten Publishers). A metal oxide having a perovskite-type structure is generally expressed by a chemical formula $ABO_3$. Element A and element B of a perovskite-type metal oxide respectively occupy particular positions in the unit cell called A sites and B sites by taking forms of ions. For example, in a unit cell of a cubic system, element A occupies apexes of a cube and element B occupies the body center of the cube. Element O is an oxygen anion and occupies face-centered positions of the cube. A-site element is twelve coordinated and B-site element is six coordinated.

The metal oxide represented by general formula (1) above contains Na, Ba, and Bi as the metal elements that occupy the A sites and Ti, Nb, and Fe as the metal elements that occupy the B sites. Some of Na, Ba, and Bi atoms may occupy B sites as well and some of Ti, Nb, and Fe atoms may occupy A sites as well.

The molar ratio of the B-site element to element O in general formula (1) is 1:3. The molar ratio may slightly deviate from this ratio (for example, 1.00:2.94 to 1.00:3.06) as long as the metal oxide has a perovskite-type structure as the primary phase. Such an oxide is still in the range of the present invention. The fact that the metal oxide has a perovskite-type structure can be confirmed by structural analysis by X-ray diffraction, electron-beam diffraction, or the like.

The form of the piezoelectric material according to the embodiment is not particularly limited. The piezoelectric material may be a ceramic, a powder, a single crystal, a film, or a slurry, for example. The piezoelectric material is preferably a ceramic. For the purposes of the present invention, the term "ceramic" means a polycrystal, that is, an aggregate (also called bulk) of crystal grains sintered through a heat treatment, containing a metal oxide as a basic component. Those materials which are processed after sintering are also referred to as ceramics.

General formula (1) represents a composition of a metal oxide that contains (1−x) moles of $\{(Na_yBa_{1-z})(Nb_zTi_{1-z})O_3\}$ (NN-BT) and x moles of $BiFeO_3$. A perovskite-type metal oxide represented by general formula (1) includes a solid solution of $NaNbO_3$ and $BaTiO_3$ obtained by dissolving barium titanate in sodium niobate; however, Na is highly volatile during sintering and thus Na may become deficient relative to Nb. In general formula (1), the subscript for Na is "y" to differentiate from the subscript "z" for Nb since there are cases where Na in the piezoelectric material becomes deficient.

NN-BT and $BiFeO_3$ need not form a perfect solid solution. However, when NN-BT and $BiFeO_3$ are homogeneously dissolved and a perovskite-type structure single phase is formed, the range of improvement of the piezoelectric constant is increased due to the phase boundary effect among the orthorhombic structure of NN, the tetragonal structure of BT, and the rhombohedral structure of $BiFeO_3$.

In general formula (1), the range for x is $0<x\leq0.015$. If x representing the molar ratio of $BiFeO_3$ is more than 0.015, the Curie temperature may become excessively low and depolarization may occur by heat applied during the device production process or heat generated by operation of the device. $BiFeO_3$ achieves the effect of improving the insulation resistance and piezoelectricity even when the amount thereof is small. More preferably, $0.001\leq x\leq0.015$ and most preferably $0.001\leq x\leq0.013$. When x is within the range described above, the piezoelectric constant improves by 10% or more relative to compositions not containing $BiFeO_3$.

In general formula (1), the range for y is $0.80\leq y\leq0.95$. When the sodium content y is less than 0.80, the percentage of sodium relative to niobium becomes 95% or less. If sodium is deficient by more than 5%, such a composition will have impurity phases (phases that have X-ray diffraction patterns similar to those of $Ba_4Nb_2O_9$, $Ba_6Ti_7Nb_9O_{42}$, $Ba_3Nb_4Ti_4O_{21}$, $Ba_3Nb_{3.2}Ti_5O_{21}$, and the like) and the samples exhibit low insulating properties. When the sodium content y exceeds 0.95, the piezoelectricity is degraded. When the sodium content y is within the range of $0.80\leq y\leq0.95$, generation of impurity phases can be suppressed and good piezoelectricity can be obtained. More preferably, $0.80\leq y\leq0.90$.

In general formula (1), the range of z is $0.85\leq z\leq0.95$. When the niobium content z is less than 0.85, the Curie temperature becomes lower than 120° C. When the niobium content z is more than 0.95, the piezoelectricity is degraded. More preferably, $0.85\leq z\leq0.90$.

The piezoelectric material of the embodiment contains 0.04 mol % or more and 2.00 mol % or less and preferably 0.20 mol % or more and 1.00 mol % or less of Cu relative to 1 mol of the perovskite-type metal oxide represented by general formula (1). The unit "mol %" of the Cu content refers to the ratio on a metallic Cu basis. When more than 2.00 mol % of Cu is contained relative to 1 mol of the perovskite-type metal oxide, impurity phases occur and the piezoelectricity is degraded. When the Cu content is less than 0.04 mol %, the insulation resistance is degraded and insufficient polarization may result.

When 0.04 mol % or more and 2.00 mol % or less of Cu is contained relative to 1 mol of the perovskite-type metal oxide represented by general formula (1), the resistivity, mechanical quality factor, Young's modulus, and density are increased.

Copper (Cu) may occupy A sites (twelve coordinated), B sites (six coordinated), or both A site and B sites of the perovskite structure or may be present at grain boundaries of the ceramic.

When crystals containing sodium niobate are sintered, Na may evaporate or diffuse and the resulting sample composition after sintering may become deficient relative to Nb. In other words, defects may occur at A sites. However, if an excessive amount of a Na raw material is weighed in weighing the raw material powders, the insulating property of the sintered material may be degraded. However, adding Cu to crystals containing sodium niobate causes some of Cu atoms to occupy A sites of sodium niobate to compensate for the defects. Thus, in some instances, it is advisable to weigh raw materials so that the Na content in the composition after firing is deficient by not more than 5% relative to Nb and to add Cu.

Copper (Cu) need not occupy A sites or B sites and may be present at grain boundaries. Copper having a low melting point accelerates liquid phase sintering. As a result, Cu sometimes segregates in grain boundaries. Once the liquid phase sintering is accelerated, pores in the sintered body are decreased and the density of the sintered body is increased. As a result of suppressing generation of pores, the mechanical quality factor is increased and the Young's modulus is increased. The distribution of Cu within a sample and the sites occupied by. Cu in the crystal can be examined by using an electron microscope or a transmission electron microscope or by energy dispersive X-ray spectrometry, X-ray diffraction, or Raman scattering.

In general formula (1), y may be smaller than z ($y<z$). When y is smaller than z, Cu is incorporated in the crystal lattice and the resistivity, mechanical quality factor, Young's modulus, and density can be increased. The composition of the starting materials may be adjusted so that y becomes smaller than z. If y is equal to or greater than z, the insulating properties of the sample may be degraded. More preferably, y is 95% or more but less than 100% of z.

In order to prevent depolarization of the piezoelectric material by heat applied during the device production steps or by heat generated by driving the device, the composition may be selected so that the Curie temperature of the piezoelectric material is 120° C. or higher, preferably 125° C. or higher, and most preferably 130° C. or higher. The Curie temperature of the piezoelectric material can be controlled by adjusting the compositional parameters x, y, and z, the Cu content, and the micro-order composition uniformity of the piezoelectric material.

In this description, the Curie temperature refers to the temperature estimated by the Curie-Weiss law and the temperature at which the dielectric constant reaches maximal near a ferroelectric-to-paraelectric (cubic) phase transition temperature.

In order to facilitate the production of the piezoelectric material or adjust the physical properties of the piezoelectric material, some of Ba atoms may be substituted with a divalent metal element, for example, Sr or Ca. Similarly, some of Nb atoms may be substituted with a tetravalent metal element, for example, Ta or V, as long as the substitution is within the range of 20 mol % or less. Some of Ti atoms may be substituted with Zr or Sn within the range of 20 mol % or less. Some of Na atoms may be substituted with Li within the range of 15 mol % or less. Moreover, 5 mol % or less of at least one element selected from Mn, Ni, and Zn may be added relative to 1 mol of the perovskite-type metal oxide represented by general formula (1) and 5 mol % or less of at least one element selected from La, Ce, Pr, Nd, Pm, Sm, Eu, Gd, Tb, Dy, Ho, Er, Tm, and Yb may be added relative to 1 mol of the perovskite-type metal oxide represented by general formula (1). Furthermore, 0.001 parts by weight or more and 4.000 parts by weight or less of an auxiliary component containing at least one element selected from Si and B may be added relative to 100 parts by weight of the piezoelectric material.

To produce a piezoelectric ceramic (sintered body) from the piezoelectric material of an embodiment, a compact is prepared before firing. This compact is a solid article formed by molding raw material powders. The raw material powders may have high purity. Powders and liquids of metal oxides, metal salts, etc., of the metals constituting the piezoelectric material can be used as the raw material powders. Perovskite-type metal oxide powders such as a barium titanate powder, a sodium niobate powder, and a bismuth ferrate powder can be used as the raw materials. Powders of various copper compounds such as copper(I) oxide, copper(II) oxide, copper carbonate, copper(II) acetate, and copper oxalate can be used as a raw material for the Cu component.

Examples of the molding method include uniaxial pressing, cold hydrostatic pressing, warm hydrostatic pressing, casting, and extrusion molding. In preparing the compact, granulated powders may be used. When a compact prepared from granulated powders is sintered, the distribution of the crystal grain size easily becomes uniform.

The method for granulating raw material powders of the piezoelectric material is not particularly limited. From the standpoint of making the granule size of the granulated powder more uniform, a spray dry method may be employed as the granulating method.

Examples of the binder that can be used in granulation include polyvinyl alcohol (PVA), polyvinyl butyral (PVB), and acrylic resins. The amount of the binder added is preferably 1 to 10 parts by weight relative to the raw material powders of the piezoelectric material and more preferably 2 parts by weight to 5 parts by weight from the viewpoint of increasing the density of the compact.

The method for sintering the compact is not particularly limited. Examples of the sintering method include sintering in an electric furnace, sintering in a gas furnace, an electric heating method, a microwave sintering method, a millimeter wave sintering method, and hot isostatic pressing (HIP). A continuous furnace or a batch furnace may be used for sintering in an electric furnace of a gas furnace.

The sintering temperature is not particularly limited. Since $BiFeO_3$ and Cu are added to NN-BT in preparing the piezoelectric material of the embodiment, sufficient piezoelectricity can be yielded by performing a low-temperature process. Whereas a piezoelectric ceramic material based on NN-BT of the related art cannot achieve sufficient density and piezoelectric performance unless the sintering temperature is 1280° C. or higher, the piezoelectric material of this embodiment gives a piezoelectric ceramic that has sufficient density and piezoelectric performance even it is sintered at about 1050° C. to 1150° C.

In order to stabilize the properties of the piezoelectric material obtained by the sintering treatment while achieving high reproducibility, the sintering treatment may be performed for 2 hours to 48 hours while controlling the sintering temperature constant within the above-described range. A two-stage sintering method may also be employed but a method that does not involve rapid temperature change is more preferable from the viewpoint of productivity.

The piezoelectric material obtained by the sintering treatment is polished and may be heat-treated at a temperature equal to or higher than the Curie temperature. When the piezoelectric material is mechanically polished, residual stress occurs inside the piezoelectric material. However, the residual stress is relaxed by a heat treatment at a temperature equal to or higher than the Curie temperature and the piezoelectric properties of the piezoelectric material are further improved. The length of time of the heat treatment is not particularly limited but may be 1 hour or longer.

The crystal grains of the piezoelectric material have an average grain size (average equivalent circle diameter) of 0.3 μm or more and 100 μm or less. The strength of the piezoelectric material may not be sufficient for cutting and polishing if the average crystal grain size exceeds 100 μm. The piezoelectricity is degraded if the average grain size is less than 0.3 μm. More preferably, the average grain size is 0.5 μm or more and 60 μm or less.

In the case where the piezoelectric material of the embodiment is used as a film on a substrate, the thickness of the piezoelectric material is preferably 200 nm or more and 10 μm or less and more preferably 300 nm or more and 3 μm or less. This is because a film of the piezoelectric material having a thickness of 200 nm or more and 10 μm or less exhibits a sufficient electromechanical conversion function as a piezoelectric element.

The method for forming the film is not particularly limited. Examples of the method include a chemical solution deposition method (CSD method), a sol-gel method, an organic metal chemical vapor deposition method (MOCVD method), a sputtering method, a pulsed laser deposition method (PLD method), a hydrothermal synthesis method, and an aerosol deposition method (AD method). Among these, a chemical solution deposition method and a sputtering method are preferred since films having large areas can be easily formed. The substrate used together with the piezoelectric material may be a single-crystal substrate cut and polished at a (001) face or a (110) face. When a single crystal substrate cut and polished at a particular crystal surface is used, the piezoelectric material film formed on the surface of the substrate can be strongly oriented in the same direction.

Piezoelectric Element

A piezoelectric element that uses a piezoelectric material according to an embodiment of the present invention will now be described.

FIG. 1 is a schematic view of a piezoelectric element according to an embodiment of the invention. The piezoelectric element includes a first electrode 1, a piezoelectric material portion 2, and a second electrode 3. A piezoelectric material according to an embodiment of the present invention is used as the piezoelectric material constituting the piezoelectric material portion 2.

The piezoelectric properties of the piezoelectric material according to an embodiment of the invention can be assessed by preparing a piezoelectric element that includes a first electrode and a second electrode. The first and second electrodes are each formed of a conductive layer having a thickness of about 5 nm to 10 μm. The material therefor is not particularly limited and any material that is usually used in piezoelectric elements can be used. Examples thereof include metals such as Ti, Pt, Ta, Ir, Sr, In, Sn, Au, Al, Fe, Cr, Ni, Pd, Ag, and Cu and compounds of these.

The first electrode and the second electrode may be composed of one of these materials or may be constituted by two or more of these materials stacked on top of each other. The first electrode may be made of a material different from that of the second electrode.

The method for producing the first electrode and the second electrode is not limited. The electrodes may be formed by baking a metal paste, by sputtering, or by a vapor deposition method, for example. Both the first electrode and the second electrode may be patterned into a desired shape.

The piezoelectric element more preferably has polarization axes oriented in a particular direction. When the polarization axes are oriented in a particular direction, the piezoelectric constant of the piezoelectric element can be increased.

The method for polarizing the piezoelectric element is not particularly limited. The polarization treatment may be conducted in air or oil. The temperature employed for polarization may be 60° C. to 160° C. but the optimum condition slightly differs depending on the composition of the piezoelectric material constituting the piezoelectric element. The electric field applied to perform polarization may be equal to or greater than the coercive electric field of that material and, in particular, 1 to 5 kV/mm.

The piezoelectric constant and the mechanical quality factor of the piezoelectric element can be determined by calculation based on a Japan Electronics and Information Technology Industries Association standard (JEITA EM-4501) by the observed resonance frequency and antiresonance frequency with a commercially available impedance analyzer. This method is hereinafter referred to as a resonance-antiresonance method.

Multilayered Piezoelectric Element

A multilayered piezoelectric element that uses a piezoelectric material according to an embodiment of the present invention will now be described.

The multilayered piezoelectric element according to an embodiment of the present invention includes piezoelectric material layers and electrode layers that are alternately stacked. The electrode layers include at least one internal electrode. The piezoelectric material layers contain a piezoelectric material according to an embodiment of the invention.

Figure 2A:
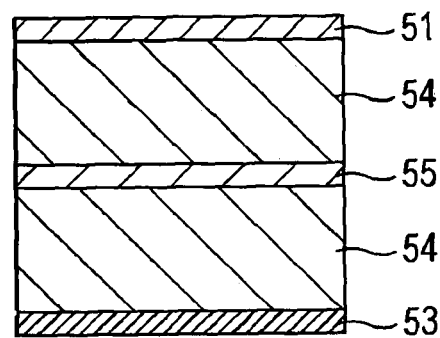
FIGS. 2A and 2B are schematic cross-sectional views showing multilayered piezoelectric elements according to embodiments of the invention.

FIG. 2A is a schematic cross-sectional view of a multilayered piezoelectric element according to an embodiment of the present invention. The multilayered piezoelectric element includes piezoelectric material layers 54 and electrodes that includes an internal electrode 55, and the piezoelectric material layers 54 and layers of the electrodes are alternately stacked. The piezoelectric material layers 54 are composed of the piezoelectric material described above. The electrodes may include external electrodes such as a first electrode 51 and a second electrode 53 in addition to the internal electrode 55.

Figure 2B:
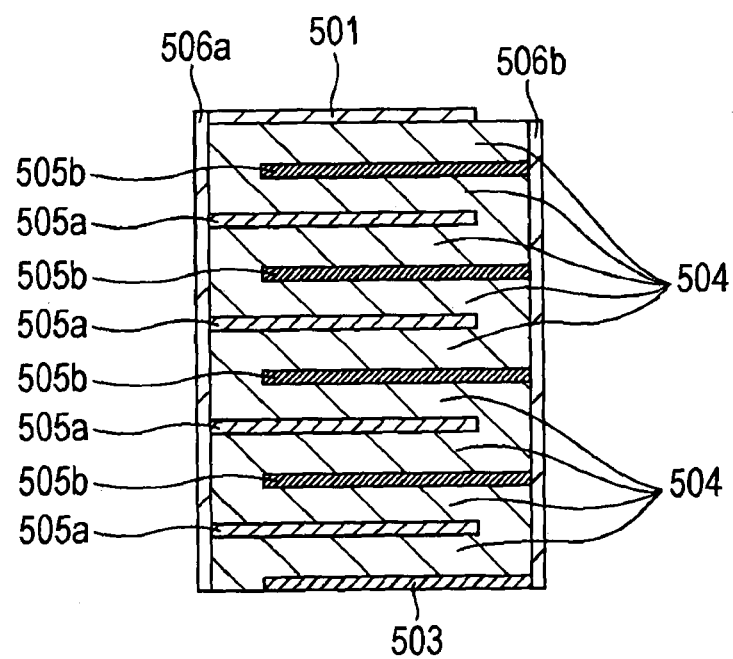

FIG. 2A shows an example of a structure of the multilayered piezoelectric element according to an embodiment of the present invention in which a stack 56 that includes two piezoelectric material layers 54 and the internal electrode 55 that are alternately stacked is held between the first electrode 51 and the second electrode 53. However, as shown in FIG. 2B, the number of the piezoelectric material layers and the number of the internal electrodes may be increased and there is no limit as to the number of the layers. A multilayered piezoelectric element shown in FIG. 2B has a structure in which a stack that includes nine piezoelectric material layers 504 and eight layers of internal electrodes 505 (505a and 505b) that are alternately stacked is held between a first electrode 501 and a second electrode 503. An external electrode 506a and an external electrode 506b are provided to short-circuit the internal electrodes alternately formed.

The shape and size of the internal electrodes 55 and 505, the external electrodes 506a and 506b, the first electrodes 51 and 501, and the second electrodes 53 and 503 are not necessarily the same as those of the piezoelectric material layers 54 and 504. The electrodes may be divided into plural parts.

The internal electrodes 55 and 505 and the external electrodes 506a and 506b are each formed of a conductive layer having a thickness of about 5 nm to 2000 nm. The material therefor is not particularly limited and any material that is usually used in piezoelectric elements can be used. Examples thereof include metals such as Ti, Pt, Ta, Ir, Sr, In, Sn, Au, Al, Fe, Cr, Ni, Pd, Ag, and Cu and compounds thereof. The internal electrodes 55 and 505 and the external electrodes 506a and 506b may each be composed of one or of these materials, a mixture of two or more of these materials, or an alloy of two or more of these materials, or may be obtained by stacking two or more of these materials. The respective electrodes may be composed of different materials. From the viewpoint of the cost of electrode material, the internal electrodes 55 and 505 may contain at least one selected from Ni and Cu. When at least one selected from Ni and Cu is used in the internal electrodes 55 and 505, the multilayered piezoelectric element may be fired in a reducing atmosphere.

The internal electrode of a multilayered piezoelectric element according to an embodiment of the invention may contain Ag and Pd and the weight ratio of the weight M1 of Ag contained to the weight M2 of Pd contained (M1/M2) is preferably 1.5≤M1/M2≤9.0 and more preferably 2.3≤M1/M2≤4.0. At a weight content ratio M1/M2 of less than 1.5, the sintering temperature of the internal electrode is increased, which is not desirable. In contrast, when the weight ratio M1/M2 exceeds 9.0, the internal electrode comes to have an island shape and becomes nonuniform in the surface, which is also not desirable.

As shown in FIG. 2B, electrodes including the internal electrodes 505 may be short-circuited to each other in order to achieve phase match of the drive voltage. For example, the internal electrodes 505a may be short-circuited to the first electrode 501 by using the external electrode 506a. The internal electrodes 505b may be short-circuited to the second electrode 503 by using the external electrode 506b. The form in which the electrodes are short-circuited to each other is not particularly limited. Electrodes and/or wires for short-circuiting may be formed on side surfaces of the multilayered piezoelectric element, or a through hole penetrating the piezoelectric material layers 504 may be formed and may be filled with a conductive material so as to short-circuit between the electrodes.

Liquid Discharge Head

A liquid discharge head according to an embodiment of the invention includes a liquid chamber that includes a vibrating unit in which the piezoelectric element or the multilayered piezoelectric element described above is contained, and a discharge port communicating with the liquid chamber. The liquid discharged from the liquid discharge head of this embodiment may be any flowing material. For example, water-based liquids and non-water-based liquids such as water, inks, and fuels can be discharged.

Figure 3A:
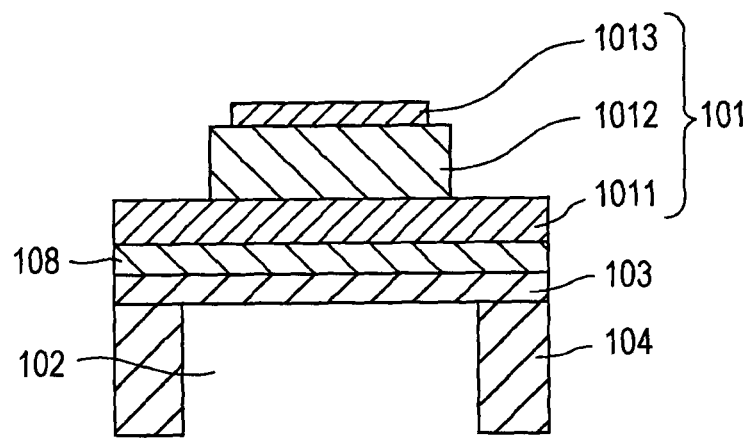
FIGS. 3A and 3B are schematic diagrams showing a liquid discharge head according to one embodiment of the invention.
Figure 3B:
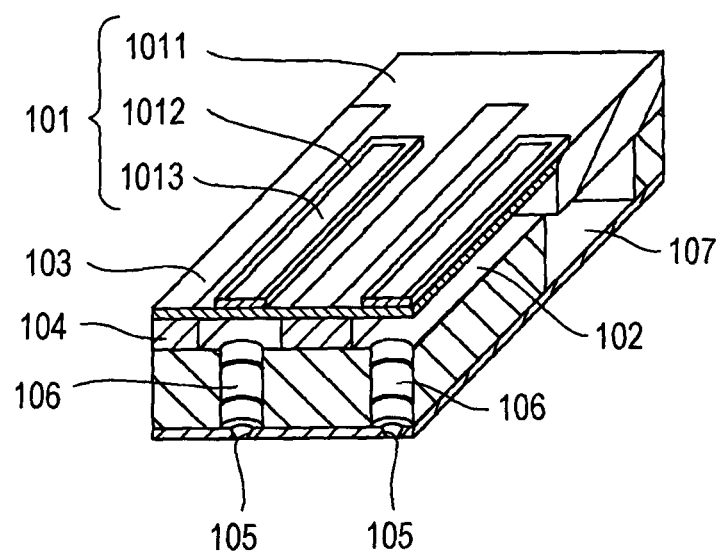

FIGS. 3A and 3B are schematic views showing an example of a structure of a liquid discharge head according to an embodiment of the invention. The liquid discharge head includes a piezoelectric element 101 according to an embodiment of the invention. The piezoelectric element 101 includes a first electrode 1011, a piezoelectric material 1012, and a second electrode 1013. As shown in FIG. 3B, the piezoelectric material 1012 is patterned as needed.

FIG. 3B is a schematic view of the liquid discharge head. The liquid discharge head includes discharge ports 105, individual liquid chambers 102, communication holes 106 that connect the individual liquid chambers 102 to the discharge ports 105, liquid chamber partitions 104, a common liquid chamber 107, a diaphragm 103, and the piezoelectric element 101. In the drawing, the piezoelectric element 101 has a rectangular shape but may have any other shape such as an elliptical shape, a round shape, or a rectangular parallelepiped shape. The piezoelectric material 1012 usually has a shape that corresponds to the individual liquid chamber 102.

The piezoelectric element 101 of the liquid discharge head and the nearby portion will now be described in detail by referring to FIG. 3A. FIG. 3A is a cross-sectional view of the piezoelectric element shown in FIG. 3B taken in the width direction. The cross sectional shape of the piezoelectric element 101 is rectangular in the drawing, but may be trapezoidal or inverted trapezoidal.

In the drawing, the first electrode 1011 is used as a lower electrode and the second electrode 1013 is used as an upper electrode. However, the arrangement of the first electrode 1011 and the second electrode 1013 is not limited to this. For example, the first electrode 1011 may be used as the lower electrode or the upper electrode and the second electrode 1013 may be used as the upper electrode or the lower electrode. A buffer layer 108 may be present between the diaphragm 103 and the lower electrode. Different names are given to the same parts depending on the device production method and the effects of the present invention are obtained irrespective of how the parts are named.

In the liquid discharge head, the diaphragm 103 moves vertically by expansion and contraction of the piezoelectric material 1012 and applies pressure to the liquid in the individual liquid chamber 102. As a result, the liquid is discharged from the discharge port 105. The liquid discharge head of this embodiment can be used in printers and production of electronic devices. The thickness of the diaphragm 103 is 1.0 µm or more and 15 µm or less and preferably 1.5 µm or more and 8 µm or less. The material for the diaphragm 103 is not particularly limited but is preferably Si which may be doped with phosphorus, boron, or the like. The buffer layer and the electrode on the diaphragm may constitute part of the diaphragm. The thickness of the buffer layer 108 is 5 nm or more and 300 nm or less and preferably 10 nm or more and 200 nm or less. The size of the discharge ports 105 is 5 µm or more and 40 µm or less in terms of equivalent circle diameter. The shape of the discharge ports 105 may be round, star shaped, rectangular shaped, or triangular shaped.

Liquid Discharge Apparatus

A liquid discharge apparatus according to an embodiment of the invention will now be described. The liquid discharge apparatus includes a stage for placing an object, and the liquid discharge head described above.

Figure 4:
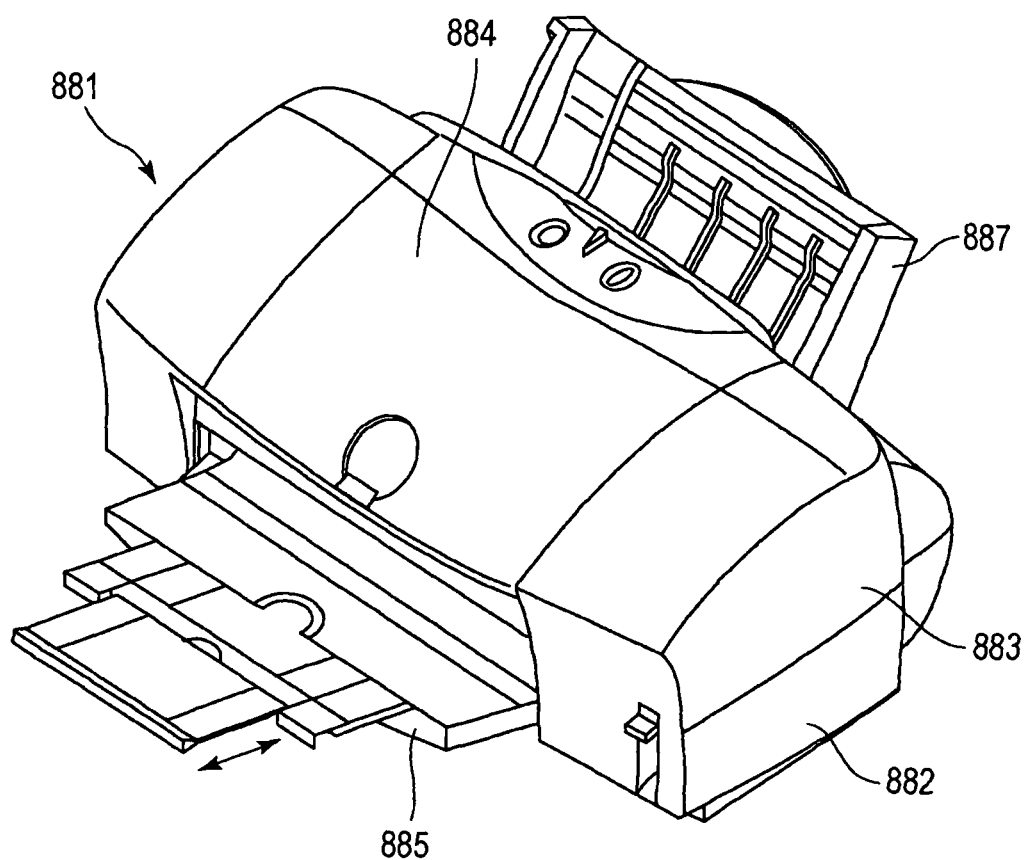
FIG. 4 is a schematic diagram showing a liquid discharge apparatus according to an embodiment of the invention.
Figure 5:
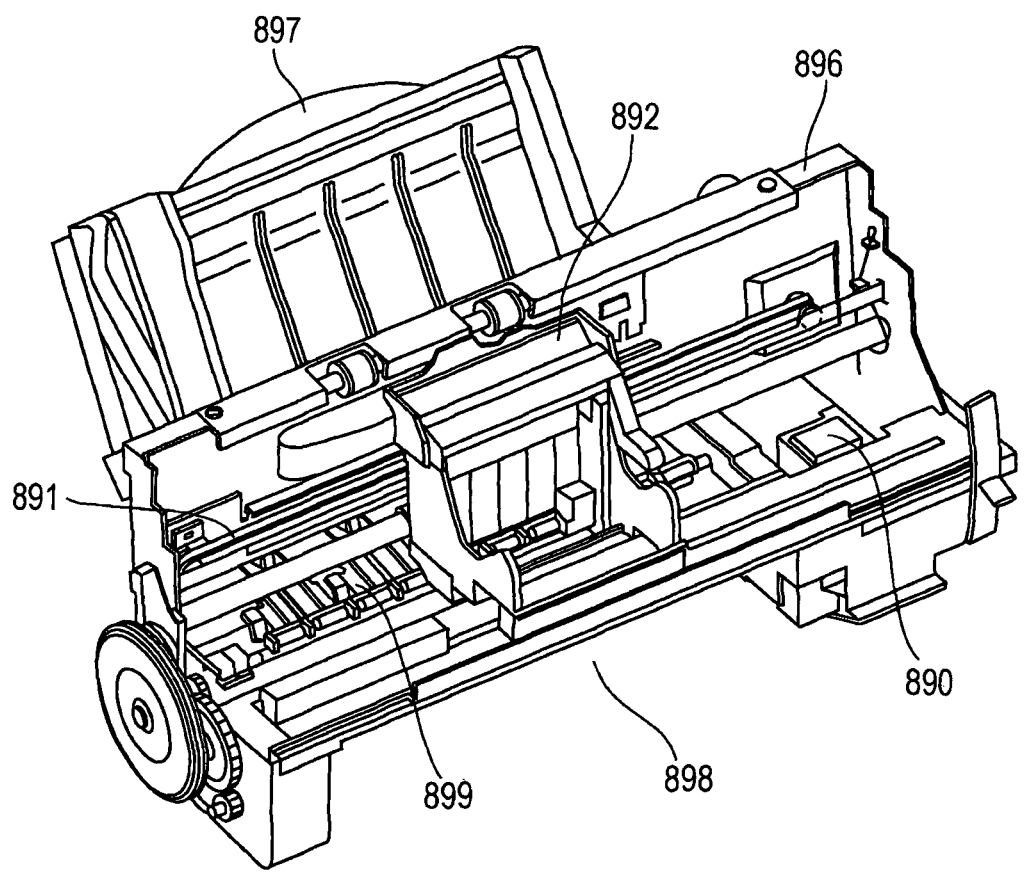
FIG. 5 is a schematic diagram showing the liquid discharge apparatus.

An example of a liquid discharge apparatus according to an embodiment of the invention is an ink jet recording apparatus shown in FIGS. 4 and 5. FIG. 5 illustrates a liquid discharge apparatus (ink jet recording apparatus) 881 shown in FIG. 4 but without outer casings 882 to 885 and 887. The liquid discharge apparatus 881 includes an automatic feeder 897 that automatically feeds a recording paper sheet serving as an object to the interior of a main unit 896. The liquid discharge apparatus 881 also includes a transporting unit 899 that guides the recording paper sheet fed from the automatic feeder 897 to a particular recording position and then from the recording position to a discharge slot 898, a recording unit 891 configured to conduct recording on the recording paper sheet transported to the recording position, and a recovery unit 890 configured to perform a recovery operation on the recording unit 891. The recording unit 891 includes a carriage 892 that houses the liquid discharge head according to an embodiment of the invention and moves back and forth over a rail. Users can choose a desired object that suits the usage. The liquid discharge head may be configured to move relative to an object placed on the stage.

In such an ink jet recording apparatus, the carriage 892 moves over the rail in response to an electrical signal output from a computer and a drive voltage is applied to the electrodes sandwiching the piezoelectric material so as to deform the piezoelectric material. As a result of deformation of the piezoelectric material, the individual liquid chamber 102 is pressurized through the diaphragm 103 shown in FIG. 3B and ink is discharged from the discharge port 105 to conduct printing. This liquid discharge apparatus can discharge a liquid uniformly at high speed and can be made compact in size.

Although a printer is given as an example in the aforementioned embodiment, the liquid discharge apparatus of the invention can be used as industrial liquid discharge apparatuses or apparatuses for drawing images etc., on target articles as well as printing apparatuses such as fax machines, multifunction printers, copy machines, and ink jet recording apparatuses.

Ultrasonic Motor

An ultrasonic motor according to an embodiment of the invention includes a vibrating body that includes the piezoelectric element of the multilayered piezoelectric element described above and a moving body that contacts the vibrating body.

Figure 6A:
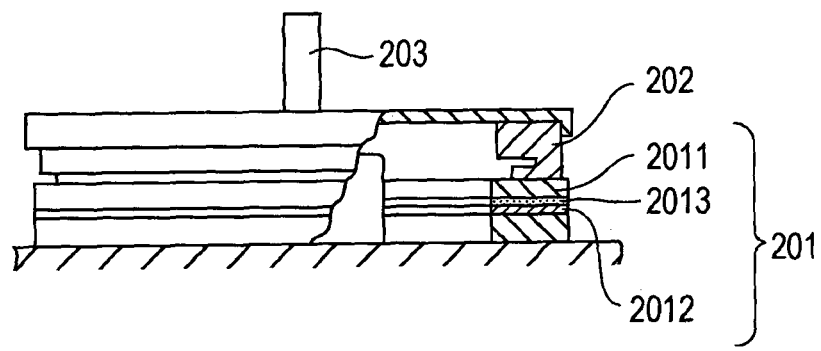
FIGS. 6A and 6B are schematic views showing ultrasonic motors according to embodiments of the invention.
Figure 6B:
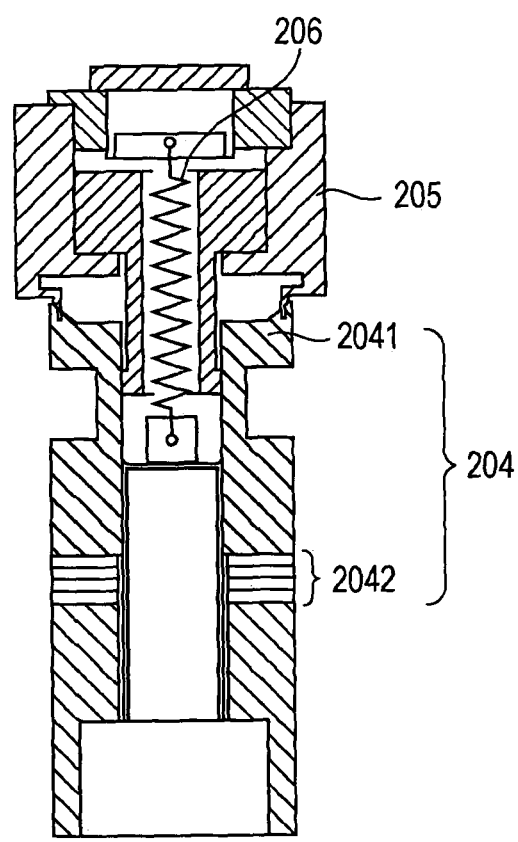

FIGS. 6A and 6B are schematic diagrams showing structures of ultrasonic motors according to embodiments of the present invention. An ultrasonic motor that includes a piezoelectric element of a single plate type according to an embodiment of the present invention is shown in FIG. 6A. The ultrasonic motor includes a vibrator 201, a rotor 202 in pressure-contact with a sliding surface of the vibrator 201 by a pressurizing spring not shown in the drawing, and an output shaft 203 integral with the rotor 202. The vibrator 201 is constituted by a metal elastic ring 2011, a piezoelectric element 2012 according to an embodiment of the invention, and an organic adhesive 2013 (epoxy- or cyanoacrylate-based adhesive, for example) that bonds the piezoelectric element 2012 to the elastic ring 2011.

The piezoelectric element 2012 includes a piezoelectric material and a first electrode and a second electrode (not shown) that sandwich the piezoelectric material. When two phases of alternating voltage having phases shifted by an odd multiple of $\pi/2$ are applied to the piezoelectric element, a bending travelling wave occurs in the vibrator 201 and the respective points on the sliding surface of the vibrator 201 undergo elliptic motion. Since the rotor 202 is in pressure-contact with the sliding surface of the vibrator 201, the rotor 202 receives frictional force from the vibrator 201 and rotates in a direction opposite to the bending travelling wave. An object to be driven not shown in the drawing is coupled to the output shaft 203 and is thus driven by the rotational force of the rotor 202. When a voltage is applied to a piezoelectric material, the piezoelectric material expands and contracts due to the transversal piezoelectric effect. An elastic member such as a metal in contact with the piezoelectric element becomes bended due to expansion and contraction of the piezoelectric material. The types of ultrasonic motors described herein utilize this principle.

An ultrasonic motor that includes a piezoelectric element having a multilayer structure is illustrated in FIG. 6B. A vibrator 204 includes a multilayered piezoelectric element 2042 and a cylindrical metal elastic member 2041 surrounding the multilayered piezoelectric element 2042. The multilayered piezoelectric element 2042 is constituted by plural layers of piezoelectric material not shown in the drawing and includes a first electrode and a second electrode on an outer surface of the stack and internal electrodes inside the stack. The metal elastic member 2041 is held with bolts to fix the multilayered piezoelectric element 2042 and constitutes the vibrator 204. When alternating voltages having different phases are applied to the multilayered piezoelectric element 2042, the vibrator 204 oscillate two different vibrations orthogonal to each other. The two vibrations are combined and form a circular vibration for driving a tip portion of the vibrator 204. An annular groove is formed in the upper portion of the vibrator 204 so as to increase the displacement of vibrations for driving. The rotor 205 is in pressure-contact with the vibrator 204 by a pressurizing spring 206 and gains the frictional force for driving. The rotor 205 is rotatably supported by bearings.

Optical Apparatus

An optical apparatus according to an embodiment of the invention will now be described. The optical apparatus includes a driving unit that includes the ultrasonic motor described above.

Figure 7A:
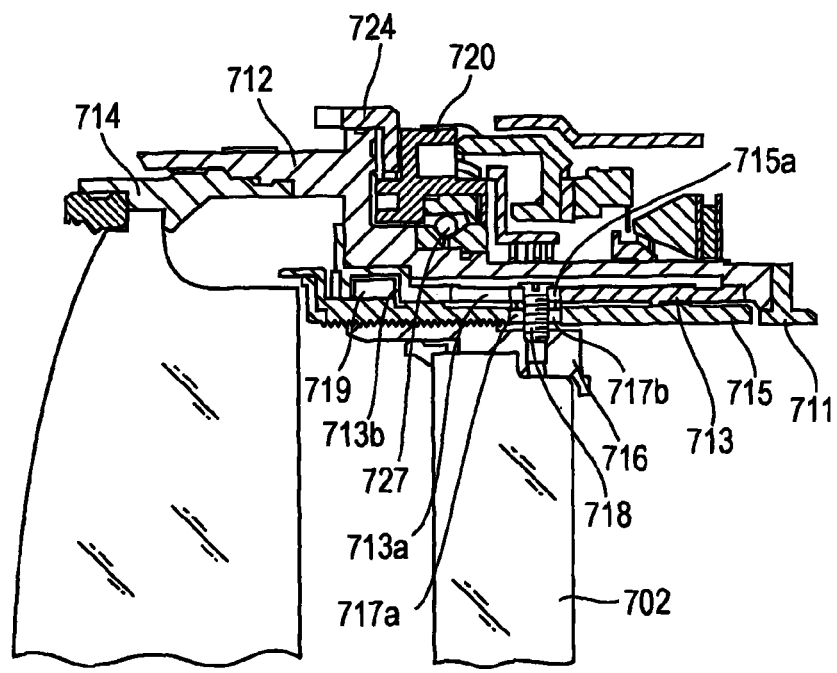
FIGS. 7A and 7B are schematic views showing an optical apparatus according to an embodiment of the invention.
Figure 7B:
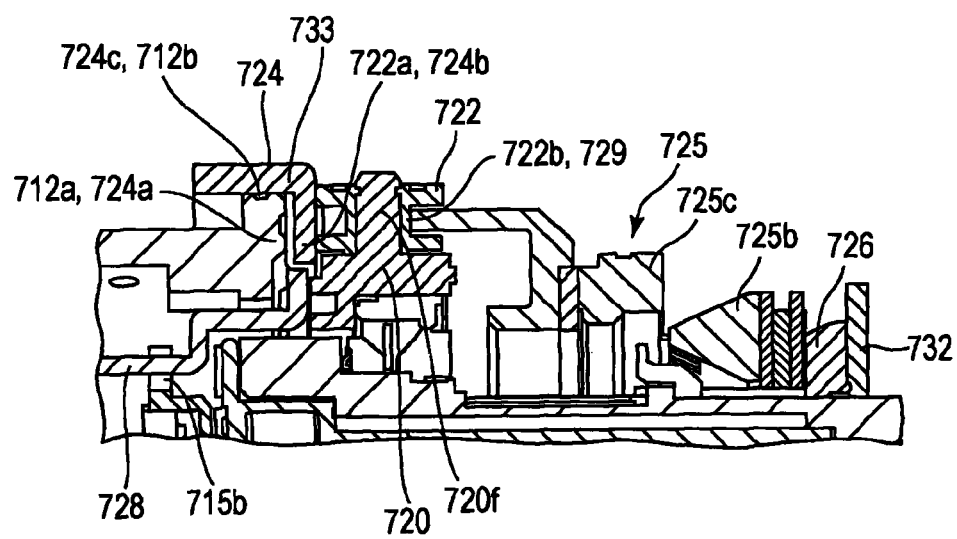
Figure 8:
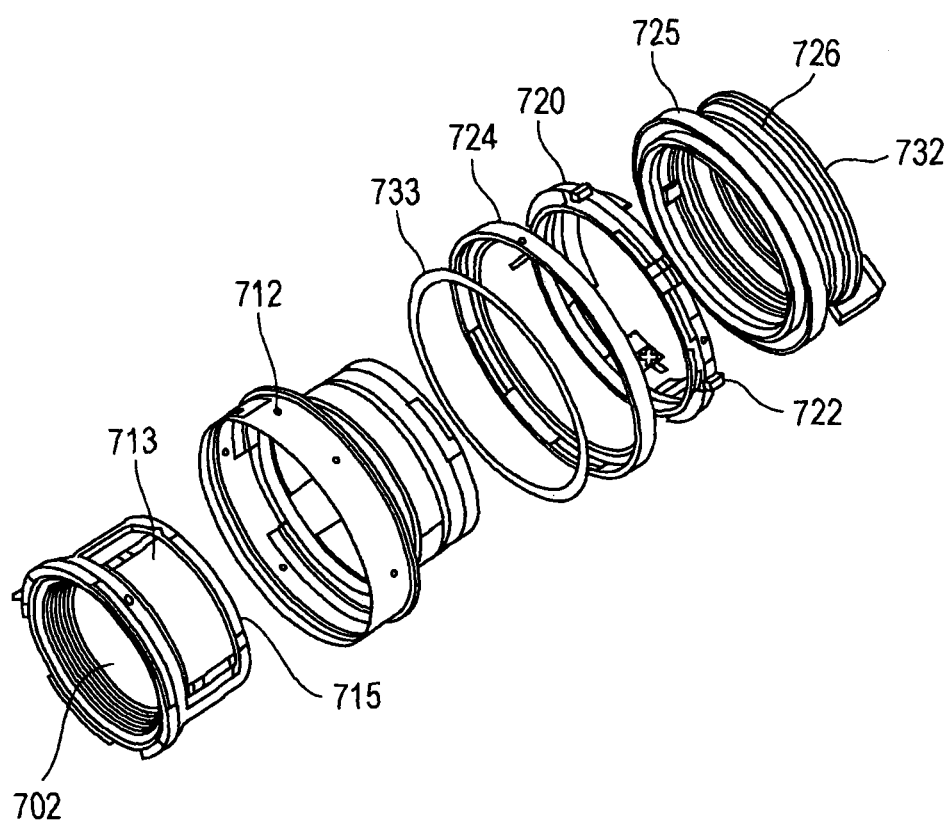
FIG. 8 is a schematic view showing the optical apparatus.

FIGS. 7A and 7B are each a cross-sectional view of a relevant part of a replaceable lens barrel of a singe-lens reflex camera, which is an example of an optical apparatus according to an embodiment of the invention. FIG. 8 is a schematic exploded view of the replaceable lens barrel.

A fixed barrel 712, a linear guide barrel 713, and a front lens group barrel 714 are fixed to a mount 711 detachable from and attachable to a camera. These parts are the fixed members of the replaceable lens barrel.

A linear guide groove 713a extending in an optical axis direction is formed in the linear guide barrel 713 to guide a focus lens 702. Cam rollers 717a and 717b that project in an outer radial direction are fixed to a rear group lens barrel 716 with a shaft screw 718 and the cam roller 717a is fitted in the linear guide groove 713a.

A cam ring 715 is rotatably fitted to the inner periphery of the linear guide barrel 713. Relative movement between the linear guide barrel 713 and the cam ring 715 in the optical axis direction is inhibited since a roller 719 fixed to the cam ring 715 is fitted in an annular groove 713b of the linear guide barrel 713. A cam groove 715a for the focus lens 702 is formed in the cam ring 715 and the cam roller 717b is fitted in the cam groove 715a simultaneously.

A rotation transmitting ring 720 is provided on the outer peripheral side of the fixed barrel 712. The rotation transmitting ring 720 is held by a ball race 727 so that it can rotate at a particular position relative to the fixed barrel 712. A roller 722 is rotatably held by a shaft 720f extending in a radial manner from the rotation transmitting ring 720. A large-diameter portion 722a of the roller 722 is in contact with a mount-side end surface 724b of a manual focus ring 724. A small-diameter portion 722b of the roller 722 is in contact with a joint member 729. Six equally spaced rollers 722 are arranged on the outer periphery of the rotation transmitting ring 720 and each roller is configured to have the above-described relationship.

A low-friction sheet (washer member) 733 is disposed on the inner radial portion of the manual focus ring 724. The low-friction sheet 733 is interposed between a mount-side end surface 712a of the fixed barrel 712 and a front-side end surface 724a of the manual focus ring 724. The outer radial surface of the low-friction sheet 733 has a ring shape and is fitted in an inner radial portion 724c. The inner radial portion 724c of the manual focus ring 724 is also fitted in an outer radial portion 712b of the fixed barrel 712. The low-friction sheet 733 reduces the friction in a rotary ring mechanism in which the manual focus ring 724 is rotated relative to the fixed barrel 712 about the optical axis.

The large-diameter portion 722a of the roller 722 and the mount-side end surface 724b of the manual focus ring 724 contact each other under pressure by being pressed by the wave washer 726 that presses the ultrasonic motor 725 toward the front side of the lens. The force from the wave washer 726 pressing the ultrasonic motor 725 toward the front side of the lens also causes the small-diameter portion 722b of the roller 722 and the joint member 729 to contact each other under an adequate degree of pressure. The wave washer 726 is confined from moving in the mount direction by a washer 732 bayonet-mounted to the fixed barrel 712. The spring force (urging force) generated by the wave washer 726 is transmitted to the ultrasonic motor 725 and to the roller 722 and serves as thrusting force of the manual focus ring 724 against the mount-side end surface 712a of the fixed barrel 712. In other words, the manual focus ring 724 is assembled while being urged against the mount-side end surface 712a of the fixed barrel 712 via the low-friction sheet 733.

Accordingly, when the ultrasonic motor 725 is driven and rotated with respect to the fixed barrel 712 by a control not shown in the drawing, the roller 722 rotates about the center of the shaft 720f because the joint member 729 makes frictional contact with the small-diameter portion 722b of the roller 722. As the roller 722 rotates about the shaft 720f, the rotation transmitting ring 720 is rotated about the optical axis (automatic focusing operation).

When rotation force about the optical axis is applied to the manual focus ring 724 from a manual operation input unit not shown in the drawing, the roller 722 rotates about the shaft 720f since the mount-side end surface 724b of the manual focus ring 724 is in pressure-contact with the large-diameter portion 722a of the roller 722. As the large-diameter portion 722a of the roller 722 rotates about the shaft 720f, the rotation transmitting ring 720 is rotated about the optical axis. The ultrasonic motor 725 at this time is prevented from rotating due to the frictional retention force of a rotor 725c and a stator 725b (manual focusing operation).

Two focus keys 728 are installed in the rotation transmitting ring 720 at positions opposite to each other and fitted in notches 715b at the front tip of the cam ring 715. When automatic focusing operation or manual focusing operation is conducted and the rotation transmitting ring 720 is rotated about the optical axis, the rotation force is transmitted to the cam ring 715 via the focus keys 728. When the cam ring 715 is rotated about the optical axis, the rear lens group barrel 716 inhibited from rotating due to the cam roller 717a and the linear guide groove 713a moves back and forth along the cam groove 715a in the cam ring 715 by the cam roller 717b. This drives the focus lens 702 and focusing operation is conducted.

Although a replaceable lens barrel of a single-lens reflex camera has been described as an example of the optical apparatus of the present invention, the scope of the invention is not limited to this. For example, the invention can be applied to any optical apparatus that has an ultrasonic motor in a driving unit irrespective of the type of cameras, such as compact cameras, digital still cameras, or cellular phones with cameras.

Vibrating Apparatus and Dust Removing Device

Vibrating apparatuses for transporting and removing particles, powders, and droplets are widely used in electronic appliances.

A dust removing device that uses a piezoelectric element according to an embodiment of the present invention is described below as an example of a vibrating apparatus of the invention. A vibrating apparatus according to an embodiment of the invention includes a vibrating body that includes the piezoelectric element or the multilayered piezoelectric element disposed a diaphragm. A dust removing device according to an embodiment of the invention includes a vibrating unit that includes this vibrating apparatus.

Figure 9A:
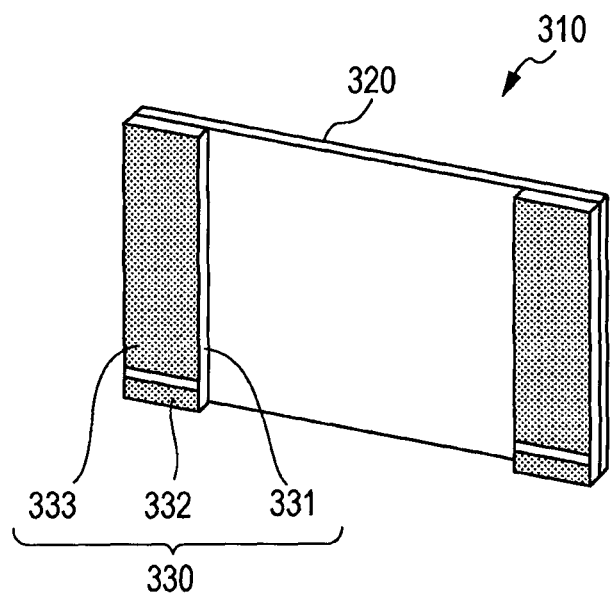
FIGS. 9A and 9B are schematic diagrams showing a vibration apparatus according to an embodiment of the invention used as a dust removing device.
Figure 9B:
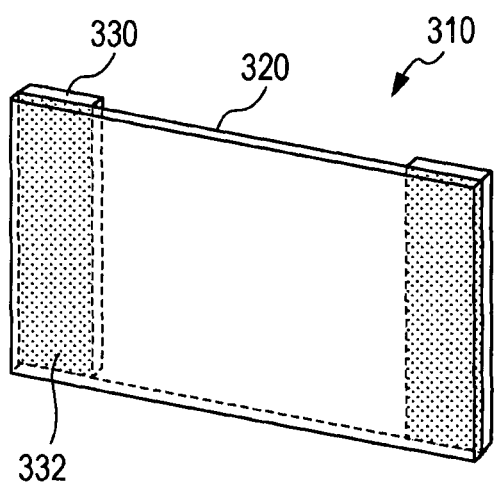

FIGS. 9A and 9B are each a schematic diagram showing an embodiment of a dust removing device. A dust removing device 310 includes a plate-shaped piezoelectric element 330 and a diaphragm 320. The piezoelectric element 330 may be a multilayered piezoelectric element according to an embodiment of the invention. The material for the diaphragm 320 is not limited. When the dust removing device 310 is used in an optical device, a light-transmitting material or light-reflecting material can be used to form the diaphragm 320.

Figure 10A:
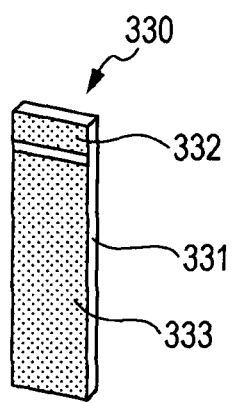
FIGS. 10A to 10C are schematic views of a piezoelectric element used in the dust removing device.
Figure 10B:
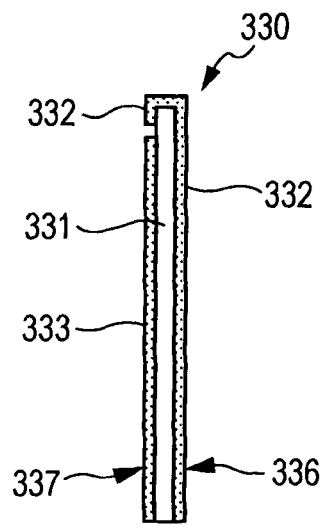
Figure 10C:
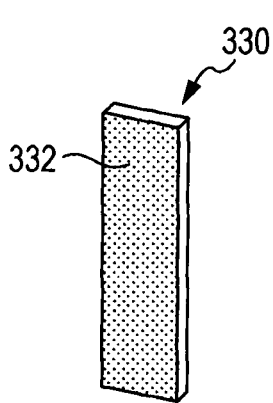

FIGS. 10A to 10C are each a schematic diagram showing a structure of the plate-shaped piezoelectric element 330 shown in FIGS. 9A and 9B. FIGS. 10A and 10C respectively show the structures of the front surface and the back surface of the plate-shaped piezoelectric element 330. FIG. 10B shows a structure of a side surface. As shown in FIGS. 9A and 9B, the plate-shaped piezoelectric element 330 includes a piezoelectric material 331, a first electrode 332, and a second electrode 333. The first electrode 332 and the second electrode 333 are disposed on the surfaces of the piezoelectric material 331 by facing each other. The piezoelectric element 330 may be a multilayered piezoelectric element. In such a case, the piezoelectric material 331 has a structure in which the piezoelectric material layers and the internal electrodes are alternately stacked and the internal electrodes are alternately short-circuited to the first electrode 332 or the second electrode 333 so that a drive waveform having a different phase can be applied to each layer of the piezoelectric material. A surface on which the first electrode 332 is disposed and which is illustrated in FIG. 10C is referred to as a first electrode surface 336 of the piezoelectric element 330. A surface on which the second electrode 333 is disposed and which is illustrated in FIG. 10A is referred to as a second electrode surface 337 of the piezoelectric element 330.

For the purposes of the invention, the "electrode surface" refers to a surface of a piezoelectric element on which an electrode is disposed. For example. As shown in FIG. 10A, the first electrode 332 may extend over to the second electrode surface 337.

As shown in FIGS. 9A and 9B, a pair of piezoelectric elements 330 are fixed to the diaphragm 320. Each piezoelectric element 330 is fixed to the diaphragm 320 with the first electrode surface 336 attached to a surface of the diaphragm 320. As the piezoelectric elements 330 are driven, stress is generated between the piezoelectric elements 330 and the diaphragm 320 and out-of-plane vibrations are generated in the diaphragm 320. The dust removing device 310 according to an embodiment of the invention removes foreign substances such as dust attached to the surface of the diaphragm 320 by using the out-of-plane vibration of the diaphragm 320. The "out-of-plane vibration" refers to an elastic vibration that deforms the diaphragm in the optical axis direction, in other words, the direction of the thickness of the diaphragm.

Figure 11A:
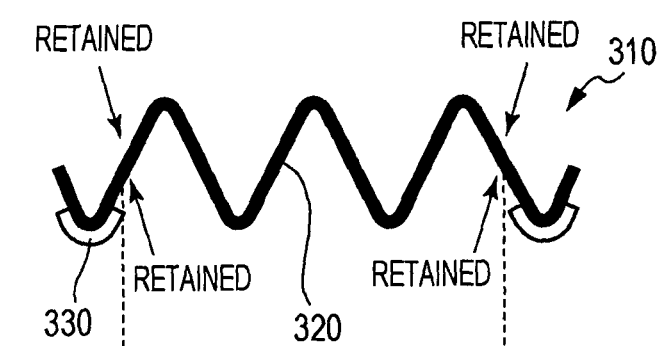
FIGS. 11A and 11B are schematic diagrams illustrating a vibrating principle of the dust removing device.
Figure 11B:
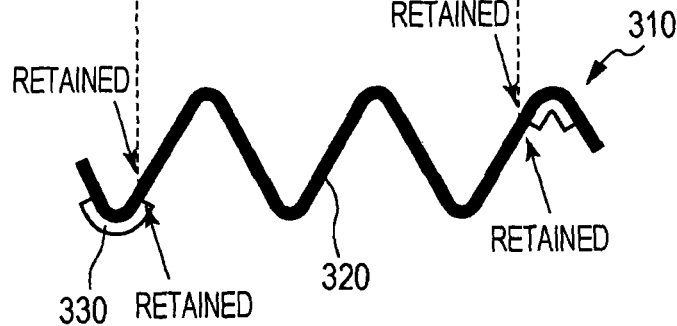

FIGS. 11A and 11B are schematic diagrams showing the principle of vibration of the dust removing device 310 according to an embodiment of the invention. FIG. 11A shows the state in which alternating voltages of the same phase are applied to the pair of piezoelectric elements 330 so as to generate an out-of-plane vibration in the diaphragm 320. The polarization directions of the piezoelectric materials constituting the pair of piezoelectric elements 330 are the same as the direction of the thickness of the piezoelectric element 330. The dust removing device 310 is driven on the seventh vibration mode. FIG. 11B shows the state in which alternating voltages of the inverted phases 180° different from each other are applied to the pair of piezoelectric elements 330 so as to generate an out-of-plane vibration in the diaphragm 320. The dust removing device 310 is driven on the sixth vibration mode. The dust removing device 310 according to an embodiment of the invention can use any of two vibration modes that suits the condition so as to effectively remove dust attached to the surface of the diaphragm.

Image-Capturing Apparatus

Figure 12:
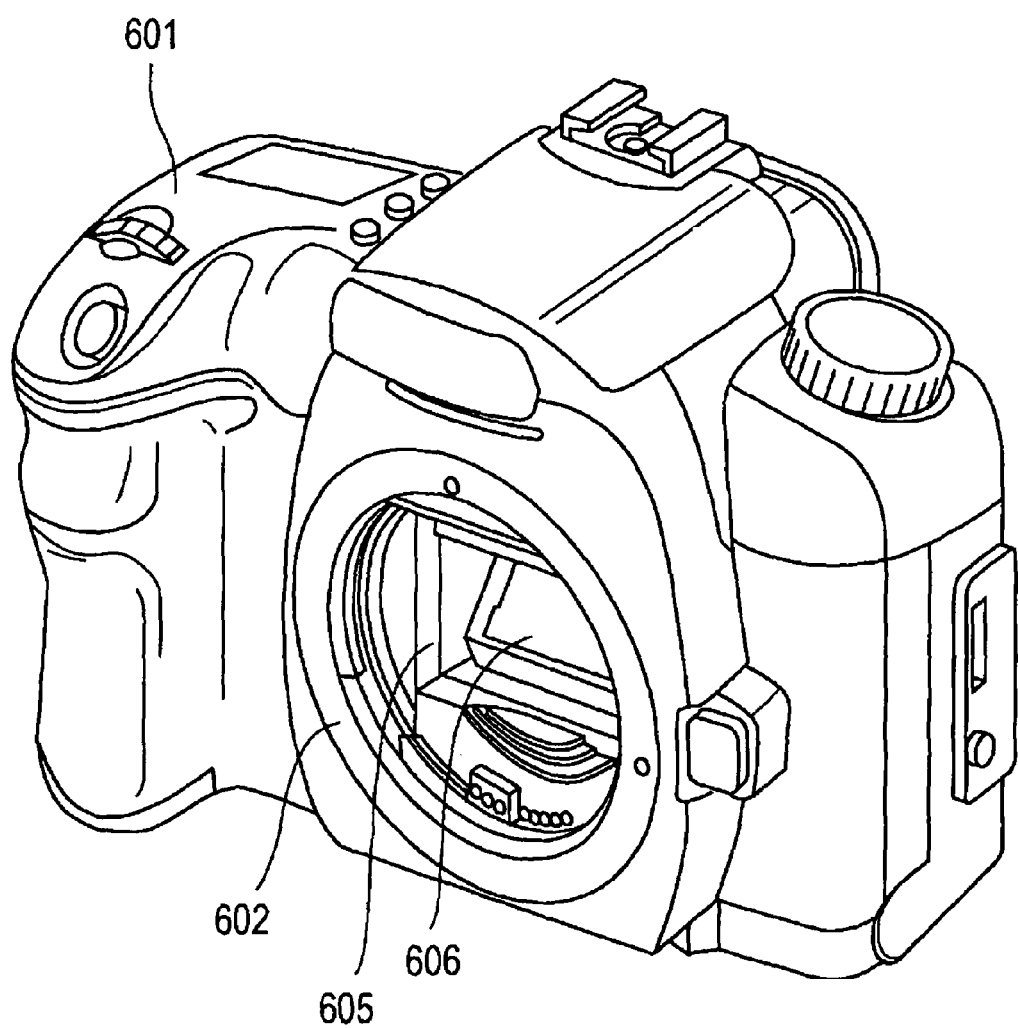
FIG. 12 is a schematic diagram showing an image-capturing apparatus according to an embodiment of the invention.
Figure 13:
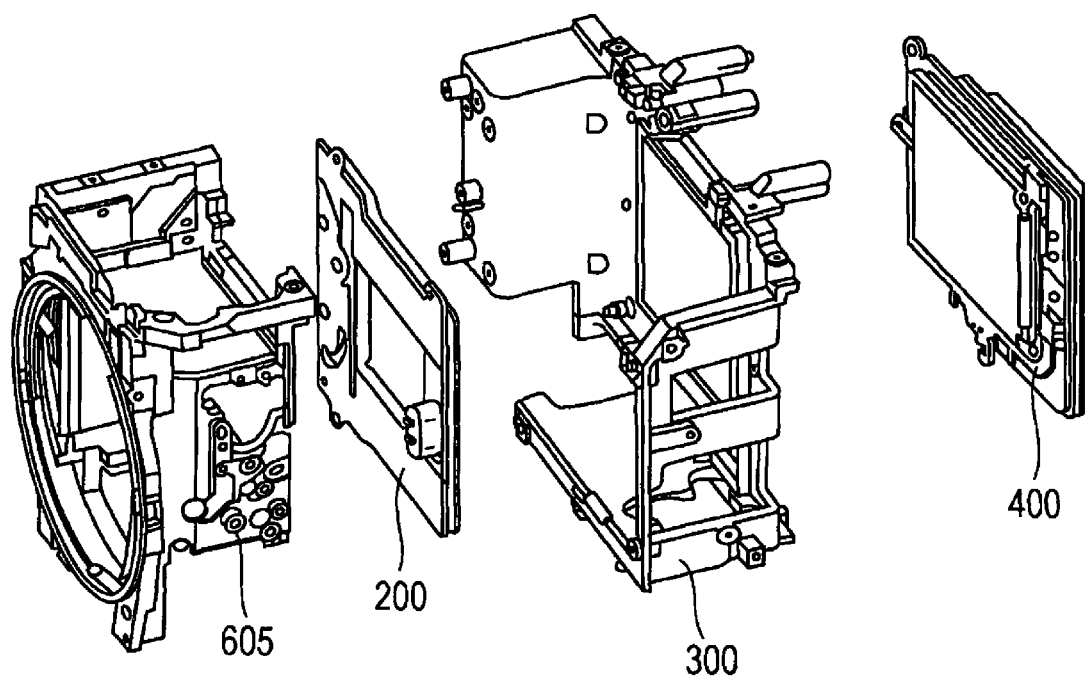
FIG. 13 is a schematic diagram of the image-capturing apparatus.

An image-capturing apparatus of the present invention will now be described. An image-capturing apparatus according to an embodiment of the present invention includes the dust removing device described above and an image-capturing element unit. The diaphragm of the dust removing device is provided at a light-receiving-surface side of the image-capturing unit. FIGS. 12 and 13 are each a diagram illustrating a digital single-lens reflex camera, which is an image-capturing apparatus according to an embodiment of the invention.

FIG. 12 is a front-side perspective view of a camera main body 601 viewed from the subject side. The camera main body 601 in FIG. 12 has an image-capturing lens unit removed. FIG. 13 is an exploded perspective view showing a schematic structure of the camera interior, for describing the dust removing device, an image-capturing unit 400, and their nearby portions.

A mirror box 605 into which an image light bundle that has passed through a taking lens is guided is disposed inside the camera main body 601. A main mirror (quick return mirror) 606 is disposed in the mirror box 605. The main mirror 606 is configured so that it can be held at an angle of 45° with respect to the image-capturing optical axis so as to guide the image light bundle toward a penta-dach mirror (not shown in the drawing) or it can be held at a position avoiding the image light bundle so as to guide the image light bundle into an image-capturing element (not shown in the drawing).

The mirror box 605 and a shutter unit 200 are disposed on the subject side of a main body chassis 300 constituting the backbone of the camera main body. The mirror box 605 and the shutter unit 200 are arranged in that order from the subject side. The image-capturing unit 400 is disposed on the photographer side of the main body chassis 300. The image-capturing unit 400 is arranged so that the image-capturing surface of the image-capturing element is parallel to a mounting surface of a mount 602, which serves as a reference in attaching an image-capturing lens unit, and that a particular distance is secured between the image-capturing surface of the image-capturing element and the mounting surface of the mount 602.

The image-capturing unit 400 includes a vibrating member of a dust removing device and an image-capturing element unit. The vibrating member of the dust removing device is disposed on the same axis as the light-receiving surface of the image-capturing element unit.

A digital single-lens reflex camera is described above as an example of an image-capturing apparatus of the invention. However, the image-capturing apparatus is not limited to this and may be an image-capturing lens unit-replaceable camera such as a mirror-less digital single-lens reflex camera not equipped with the mirror box 605. The present invention can also be applied to those apparatus and appliances which require removal of dust attaching to surfaces of optical parts, such as various image-capturing apparatuses including video cameras with a replaceable image-capturing lens unit, copy machines, fax machines, and scanners and electronic and electric appliances equipped with image-capturing apparatuses.

Electronic Apparatus

An electronic apparatus according town embodiment of the invention will now be described. The electronic apparatus includes a piezoelectric acoustic part that includes the piezoelectric element of the multilayered piezoelectric element. Examples of the piezoelectric acoustic part include speakers, buzzers, microphones, and surface acoustic wave (SAW) devices.

Figure 14:
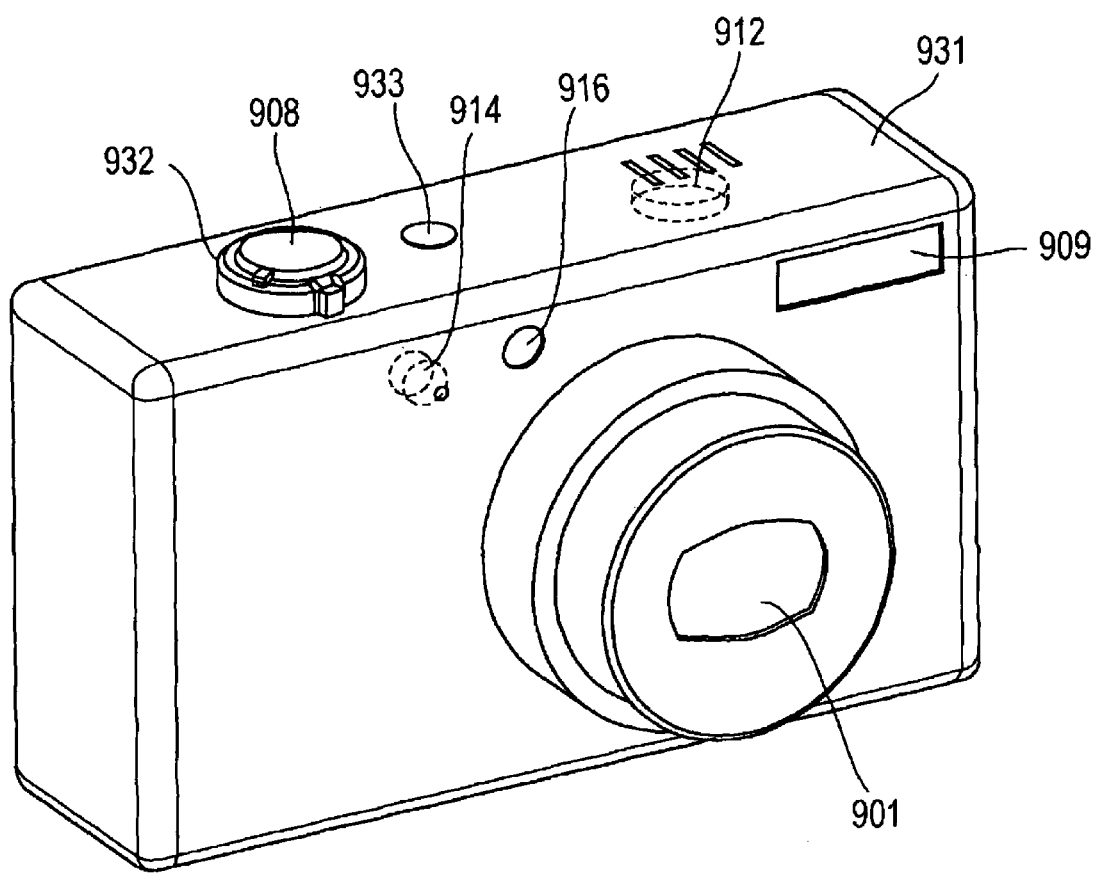
FIG. 14 is a schematic diagram showing an electronic apparatus according to an embodiment of the invention.

FIG. 14 is an overall perspective view of a main body 931 of a digital camera according to an embodiment of the invention. An optical device 901, a microphone 914, a flash 909, and an auxiliary optical part 916 are disposed at the front of the main body 931. Since the microphone 914 is built inside the main body, the microphone 914 is indicated by a dotted line. A hole for picking sound from outside is formed at the front of the microphone 914.

A power button 933, a speaker 912, a zoom lever 932, and a release button 908 for performing focusing operation are arranged on the top surface of the main body 931. The speaker 912 is built inside the main body 931 and is indicated by a dotted line. A hole for transmitting sound to outside is formed at the front of the speaker 912.

A piezoelectric acoustic part according to an embodiment of the invention is used in at least one of the microphone 914, the speaker 912, and a SAW device.

A digital camera is described above as an example of an electronic apparatus of the invention. However, the electronic apparatus is not limited to this and the present invention may be applied to those electronic appliances which have piezoelectric acoustic parts, such as sound reproducing apparatuses, sound recording apparatuses, cellular phones, and information terminals.

As has been described above, a piezoelectric element and a multilayered piezoelectric element according to embodiments of the present invention can be used in liquid discharge heads, liquid discharge apparatuses, ultrasonic motors, optical apparatuses, vibrating apparatuses, dust removing devices, image-capturing apparatuses, and electronic apparatuses.

Because the piezoelectric element and the multilayered piezoelectric element according to the invention are used, a liquid discharge head that has a nozzle density and a discharge speed comparable or superior to those of a liquid discharge head that uses lead-containing piezoelectric elements can be provided.

A liquid discharge apparatus that has discharge speed and discharge accuracy comparable or superior to those of a liquid discharge apparatus that uses lead-containing piezoelectric elements can be provided by using the liquid discharge head according to the invention.

An ultrasonic motor that has driving force and durability comparable or superior to those of an ultrasonic motor that uses a lead-containing piezoelectric element can be provided by using the piezoelectric element and the multilayered piezoelectric element according to the present invention.

An optical apparatus that has durability and operation accuracy comparable or superior to those of an optical apparatus that uses a lead-containing piezoelectric element can be provided by using the ultrasonic motor according to the invention.

A vibrating apparatus that has vibrating performance and durability comparable or superior to those of a vibrating apparatus that uses a lead-containing piezoelectric element can be provided by using the piezoelectric element and the multilayered piezoelectric element according to the invention.

A dust removing device that has dust removing efficiency and durability comparable or superior to those of a dust removing device that uses a lead-containing piezoelectric element can be provided by using the vibrating apparatus according to the present invention.

An image-capturing apparatus that has dust removing performance comparable or superior to that of an image-capturing apparatus that uses a lead-containing piezoelectric element can be provided by using the dust removing device according to the invention.

An electronic apparatus that has sound creating performance comparable or superior to that of an electronic apparatus that use s a lead-containing piezoelectric element can be provided by using a piezoelectric acoustic part that includes the piezoelectric element or the multilayered piezoelectric element according to the present invention.

A piezoelectric material according to the present invention can be used in liquid discharge heads, motors, ultrasonic vibrators, piezoelectric actuators, piezoelectric sensors, ferroelectric memories, and other devices.

EXAMPLES

A piezoelectric material according to the present invention will now be described in further detail through Examples below. The scope of the present invention is not limited by the examples described below.

The piezoelectric materials and intermediates thereof obtained in Examples and Comparative Examples were evaluated by the following procedure.

A piezoelectric material was polished to a thickness of about 0.5 mm to conduct evaluation. The density of a piezoelectric material was examined by an Archimedean method and the progress of crystallization was assumed to be sufficient when the density observed was 95% or more of the theoretical density. The crystal phases and the lattice constant of the piezoelectric material were examined by X-ray diffraction measurement.

Comparative Examples 1 to 3

A comparative metal oxide material composed of NN-BT containing neither a $BiFeO_3$ component nor a Cu component was prepared. A sodium niobate ($NaNbO_3$) powder and a barium titanate ($BaTiO_3$) powder were used as the raw materials. Sodium niobate ($NaNbO_3$) having a purity of 99% or higher was used as the sodium niobate powder and barium titanate ($BaTiO_3$) having a purity of 99% or higher was used as the barium titanate powder.

The raw materials were weighed and mixed to prepare a target composition $Na_yBa_{1-z}Nb_zTi_{1-z}O_3$ (y'=z=0.88 (Comparative Example 1), 0.85 (Comparative Example 2), or 0.90 (Comparative Example 3)). The resulting mixture was calcined at 1000° C. to 1100° C. in air for 2 to 5 hours. The calcined powder was pulverized and granulated by adding a binder. A mold was filled with the granulated powder and the granulated powder in the mold was compressed to form a compact having a diameter of 17 mm and a thickness of about 1 mm. The compact was fired in air at a maximum temperature of 1280° C. for 2 to 6 hours to obtain a sintered body.

X-ray diffraction confirmed that the resulting sample had a substantially single phase of the perovskite structure. The density of the sintered body was 95% or more of the theoretic density. The composition of the sintered body was examined by inductively coupled plasma (ICP) atomic emission spectroscopy. The sodium content was about 2% to 5% lower than the target value (y=0.84 in Comparative Example 1, y=0.80 in Comparative Example 2, and y=0.88 in Comparative Example 3).

Examples 1 to 7

A piezoelectric material of the invention composed of NN-BT containing a $BiFeO_3$ component and a Cu component was prepared as in Comparative Example 1 except for the raw material components and the feed ratios. A sodium niobate ($NaNbO_3$) powder and a barium titanate ($BaTiO_3$) powder were used as the raw materials for the NN-BT portion. Sodium niobate having ($NaNbO_3$) a purity of 99% or higher was used as the sodium niobate powder and barium titanate ($BaTiO_3$) having a purity of 99% or higher was used as the barium titanate powder.

The raw materials were mixed so that 0.50 mol % of Cu was contained relative to 1 mol of a perovskite-type metal oxide represented by general formula $(1-x)\{(Na_{y'}Ba_{1-z})(Nb_zTi_{1-z})O_3\}-xBiFeO_3$ (x=0.0010 (Example 1), 0.0025 (Example 2), 0.0050 (Example 3), 0.0075 (Example 4), 0.0100 (Example 5), 0.0130 (Example 6), or 0.0150 (Example 7), y'=0.88, and z=0.88). Copper oxide (Cu(II)O) having a purity of 99.9% was used as the raw material of Cu. The Cu content of 0.50 mol % in Example 1 means that 0.398 g of copper oxide (0.318 g of metallic Cu) was contained relative to 1 mol (172.5 g) of the perovskite-type metal oxide represented by general formula (1).

A bismuth ferrate ($BiFeO_3$) powder was used as the raw material of the $BiFeO_3$ component. The bismuth ferrate powder was prepared in advance by firing a mixture of commercially available bismuth oxide and iron(III) oxide at 800° C. for 5 hours. Alternatively, bismuth oxide and iron oxide were weighed to obtain a target composition and co-fired with NN-BT. The same effect was obtained.

The resulting mixed powder was calcined at 1000° C. to 1100° C. in air for 2 to 5 hours. The calcined powder was pulverized and granulated by adding a binder. A mold was filled with the granulated powder and the granulated powder in the mold was compressed to form a compact having a diameter of 17 mm and a thickness of about 1 mm. The compact was fired at a maximum temperature of 1100° C. in air for 1 to 6 hours to obtain a sintered body, which is an example of the piezoelectric material of the invention. A surface of the sintered body was observed with an optical microscope and the grain size was evaluated. The average grain size was 0.5 µm to 50 µm in each Example. A polarizing microscope was mainly used for observation of crystal grains. A scanning electron microscope (SEM) was used to determine the size of small crystal grains. The average equivalent circle diameter was calculated from the observed results and assumed to be the average grain size.

X-ray diffraction measurement was conducted on the piezoelectric material after sintering. It was confirmed that the samples had a substantially single phase of a perovskite structure. The density of the piezoelectric material was 97% or more of the theoretical density. The composition of each piezoelectric material was analyzed by ICP and the sodium content was lower than the target content by about 3.5% as shown by the value of y.

Examples 8 to 11

Samples of piezoelectric material of the inventions were prepared as in Example 3 except that the ratio of Cu added was changed.

Raw materials were mixed so that 0.04 mol (Example 8), 0.20 mol (Example 9), 1.00 mol (Example 10), or 2.00 mol (Example 11) of Cu was contained relative to 1 mol of a perovskite-type metal oxide represented by general formula $(1-x)\{(Na_{y'}Ba_{1-z})(Nb_zTi_{1-z})O_3\}-xBiFeO_3$ (x=0.0050, y'=0.88, and z=0.88). A sintered body was obtained by firing a compact at a maximum temperature of 1100° C. in air for 1 to 6 hours. A surface of the sintered body was observed with an optical microscope and the grain size was determined. The average grain size of each Example was 0.5 µm to 60 µm.

X-ray diffraction measurement was conducted on the piezoelectric material after sintering. It was confirmed that the samples had a substantially single phase of a perovskite structure. The density of the piezoelectric material was 97% or more of the theoretical density. The composition of each piezoelectric material was analyzed by ICP and the sodium content was lower than the target content by about 2% to 4.5% as shown by the value of y.

Examples 12 to 15

Samples were respectively prepared as in Examples 1, 3, 6, and 7 except for the raw material components and the feed ratios to prepare piezoelectric materials of the invention.

Raw materials were mixed so that 0.50 mol of Cu was contained relative to 1 mol of a perovskite-type metal oxide represented by general formula $(1-x)\{(Na_{y'}Ba_{1-z})(Nb_zTi_{1-z})O_3\}-xBiFeO_3$ (x=0.0010 (Example 12), 0.0050 (Example 13), 0.0130 (Example 14), or 0.0150 (Example 15), y'=0.85, and z=0.85). The sintered body was obtained by firing a compact at a maximum temperature of 1100° C. in air for 1 to 6 hours.

X-ray diffraction measurement was conducted on the piezoelectric material after sintering. It was confirmed that the samples had a substantially single phase of a perovskite structure. The density of the piezoelectric material was 96% or more of the theoretical density. The composition of each piezoelectric material was analyzed by ICP and the sodium content was lower than the target content by about 3.5% to 5% as shown by the value of y.

Examples 16 to 19

Samples of piezoelectric materials of the invention were respectively prepared as in Examples 1, 3, 6, and 7 except for the raw material components and the feed ratios.

Raw materials were mixed so that 0.40 mol of Cu was contained relative to 1 mol of a perovskite-type metal oxide represented by general formula $(1-x)\{(Na_{y'}Ba_{1-z})(Nb_zTi_{1-z})O_3\}-xBiFeO_3$ (x=0.0010 (Example 16), 0.0050 (Example 17), 0.0130 (Example 18), or 0.0150 (Example 19), y'=0.90, and z=0.90). The sintered body was obtained by firing a compact at a maximum temperature of 1120° C. in air for 1 to 6 hours.

X-ray diffraction measurement was conducted on the piezoelectric material after sintering. It was confirmed that the samples had a substantially single phase of a perovskite structure. The density of the piezoelectric material was 95% or more of the theoretical density. The composition of each piezoelectric material was analyzed by ICP and the sodium content was lower than the target content by about 1% to 20 as shown by the value of y.

Comparative Example 4 to 6

Comparative metal oxide materials were prepared as in Examples 1 to 7 and 12 to 19.

Raw materials were mixed so that 0.50 mol (Comparative Examples 4 and 5) or 0.40 mol (Comparative Example 6) of Cu was contained relative to 1 mol of a perovskite-type metal oxide represented by general formula $(1-x)\{(Na_{y'}Ba_{1-z})(Nb_zTi_{1-z})O_3\}-xBiFeO_3$ (x=0.0200, and y'=z=0.88 (Comparative Example 4), 0.85 (Comparative Example 5), or 0.90 (Comparative Example 6)). The sintered body was obtained by firing a compact at a maximum temperature of 1100° C. in air for 1 to 6 hours.

X-ray diffraction measurement was conducted on the piezoelectric material after sintering. It was confirmed that the samples had a substantially single phase of a perovskite structure. The density of the piezoelectric material was 91% to 94% of the theoretical density. The composition of each piezoelectric material was analyzed by ICP and the sodium content was lower than the target content by 8% at maximum.

Comparative Example 7

A comparative metal oxide material was prepared as in Example 3 and 8 to 11.

Raw materials were mixed so that 3.00 mol of Cu was contained relative to 1 mol of a perovskite-type metal oxide represented by general formula $(1-x)\{(Na_yBa_{1-z})(Nb_zTi_{1-z})O_3\}$-$xBiFeO_3$ ($x=0.0050$, $y'=z=0.88$). The sintered body was obtained by firing a compact at a maximum temperature of 1100° C. in air for 1 to 6 hours.

X-ray diffraction measurement was conducted on the piezoelectric material after sintering. It was confirmed that the sample had a substantially single phase of a perovskite structure. The density of the piezoelectric material was 92% of the theoretical density. The composition of the piezoelectric material was analyzed by ICP and no deficiency in sodium content relative to the target content was found.

A surface of each of the piezoelectric materials of Examples 1 to 19 was polished and each piezoelectric material was heat-treated at 400° C. to 1000° C. in air for 1 hour to remove organic components on the surface. A gold electrode was formed on each of two surfaces of the piezoelectric material by DC sputtering to prepare a piezoelectric element of the invention. The piezoelectric element was processed into a rectangular sample 10 mm×2.5 mm×0.5 mm in size and various properties were examined.

The metal oxide materials of Comparative Examples 1 to 7 were formed into comparative elements by performing the same process as that in Examples 1 to 19. Various properties were examined by using these comparative elements.

Unpolarized elements were used to measure the resistivity. A 10 V DC bias was applied between the two electrodes of each element and the resistivity was calculated from the leak current value 20 seconds after. A piezoelectric material or a piezoelectric element is considered to have sufficient practical insulating properties as long as this resistivity is 100 GΩ·cm or more and more preferably 130 GΩ·cm or more.

Each sample was subjected to a polarization treatment prior to examining the piezoelectricity. To be more specific, each sample was heated to 100° C. to 150° C. in an oil bath, a voltage of 20 kV/cm was applied to the sample for 30 minutes, and the sample was cooled to room temperature while applying the voltage.

The piezoelectric constant ($d_{31}$), Young's modulus ($Y_{11}$), and mechanical quality factor (Qm) of each piezoelectric material were evaluated by a resonance-antiresonance method by using the rectangular piezoelectric element.

The Curie temperature was determined by measuring the dielectric constant and the temperature at the maximal of the dielectric constant was assumed to be the Curie temperature.

Table 1 shows the resistivity, Curie temperature, absolute value of piezoelectric constant ($d_{31}$), mechanical quality factor (Qm), and Young's modulus of the elements obtained by using the piezoelectric materials of Examples 1 to 19 and the elements obtained by using the metal oxide materials of Comparative Examples 1 to 7.

TABLE 1

| | $(1-x)\{(Na_yBa_{1-z})(Nb_zTi_{1-z})O_3\}$—$xBiFeO_3$ | | | | Cu | Resistivity | Curie temperature | Piezoelectric constant | Mechanical quality factor | Young's modulus |
|---|---|---|---|---|---|---|---|---|---|---|
| | x | y' | y | z | mol % | GΩ·cm | Tc [° C.] | $|d_{31}|$ [pC/N] | Qm [—] | Y11 [GPa] |
| C. Ex. 1 | 0 | 0.88 | 0.84 | 0.88 | 0 | 50 | 200 | 43 | 280 | 127 |
| Ex. 1 | 0.0010 | 0.88 | 0.85 | 0.88 | 0.50 | 310 | 200 | 56 | 370 | 133 |
| Ex. 2 | 0.0025 | 0.88 | 0.85 | 0.88 | 0.50 | 320 | 195 | 57 | 360 | 133 |
| Ex. 3 | 0.0050 | 0.88 | 0.85 | 0.88 | 0.50 | 550 | 190 | 58 | 360 | 133 |
| Ex. 4 | 0.0075 | 0.88 | 0.85 | 0.88 | 0.50 | 380 | 165 | 55 | 360 | 133 |
| Ex. 5 | 0.0100 | 0.88 | 0.85 | 0.88 | 0.50 | 400 | 150 | 48 | 350 | 132 |
| Ex. 6 | 0.0130 | 0.88 | 0.85 | 0.88 | 0.50 | 340 | 145 | 48 | 350 | 131 |
| Ex. 7 | 0.0150 | 0.88 | 0.85 | 0.88 | 0.50 | 310 | 130 | 48 | 320 | 130 |
| C. Ex. 4 | 0.0200 | 0.88 | 0.81 | 0.88 | 0.50 | 55 | 65 | 51 | 100 | 127 |
| Ex. 8 | 0.0050 | 0.88 | 0.86 | 0.88 | 0.04 | 920 | 185 | 54 | 300 | 129 |
| Ex. 9 | 0.0050 | 0.88 | 0.86 | 0.88 | 0.20 | 780 | 185 | 56 | 330 | 133 |
| Ex. 10 | 0.0050 | 0.88 | 0.84 | 0.88 | 1.00 | 330 | 180 | 54 | 380 | 133 |
| Ex. 11 | 0.0050 | 0.88 | 0.84 | 0.88 | 2.00 | 130 | 175 | 54 | 380 | 133 |
| C. Ex. 7 | 0.0050 | 0.88 | 0.88 | 0.88 | 3.00 | 1.4 | 110 | 31 | 90 | 118 |
| C. Ex. 2 | 0 | 0.85 | 0.80 | 0.85 | 0.00 | 44 | 160 | 42 | 290 | 132 |
| Ex. 12 | 0.0010 | 0.85 | 0.82 | 0.85 | 0.50 | 290 | 170 | 47 | 380 | 133 |
| Ex. 13 | 0.0050 | 0.85 | 0.82 | 0.85 | 0.50 | 370 | 155 | 67 | 380 | 134 |
| Ex. 14 | 0.0130 | 0.85 | 0.82 | 0.85 | 0.50 | 320 | 140 | 63 | 370 | 134 |
| Ex. 15 | 0.0150 | 0.85 | 0.82 | 0.85 | 0.50 | 330 | 125 | 56 | 340 | 133 |
| C. Ex. 5 | 0.0200 | 0.85 | 0.81 | 0.85 | 0.50 | 40 | 50 | 57 | 130 | 129 |
| C. Ex. 3 | 0 | 0.90 | 0.88 | 0.90 | 0.00 | 113 | 240 | 44 | 180 | 121 |
| Ex. 16 | 0.0010 | 0.90 | 0.89 | 0.90 | 0.40 | 460 | 240 | 50 | 300 | 123 |
| Ex. 17 | 0.0050 | 0.90 | 0.88 | 0.90 | 0.40 | 490 | 220 | 74 | 290 | 123 |
| Ex. 18 | 0.0130 | 0.90 | 0.88 | 0.90 | 0.40 | 480 | 195 | 73 | 260 | 123 |
| Ex. 19 | 0.0150 | 0.90 | 0.88 | 0.90 | 0.40 | 480 | 145 | 71 | 220 | 122 |
| C. Ex. 6 | 0.0200 | 0.90 | 0.90 | 0.90 | 0.40 | 93 | 95 | 63 | 170 | 115 |

(Note)
In the table, y' represents the Na content in raw materials and y represents the Na content in a piezoelectric material after sintering.
C. Ex. denotes Comparative Example and Ex. denotes Example.

According to Table 1, the resistivity, piezoelectric constant, mechanical quality factor, and Young's modulus of the piezoelectric elements obtained by using the piezoelectric materials of Examples were improved compared to the comparative elements obtained by using the metal oxide materials of Comparative Examples 1 to 3 since a $BiFeO_3$ component and a Cu component were contained in NN-BT. However, as shown by Comparative Examples 4 to 6, the resistivity and the Curie temperature are lowered and the materials are not suitable for practical use when the content of $BiFeO_3$ component is excessively large although the piezoelectric constant is high. As shown by Comparative Example 7, the resistivity and the piezoelectric constant are lowered and the piezoelectric material is not suitable for practical used when the content of the Cu component is excessively large.

The Curie temperature was 125° C. or lower in all piezoelectric materials of Examples.

Example 20

The same raw material powders as those in Example 3 were wet-mixed at the same feed ratios as in Example 3 and dried to remove water. The mixture was calcined at 1000° C. to 1100° C. to obtain a calcined mixture. An organic binder was added to the calcined mixture and mixing was performed. The resulting mixture was formed into sheets by a doctor blade method so as to obtain green sheets each having a thickness of 50 μm.

A conductive paste for forming internal electrodes was applied to each green sheet by printing. The conductive paste was a Ag 70%-Pd 30% alloy paste. Nine green sheets with the conductive paste applied thereto were stacked and the stack was fired at 1120° C. to prepare a sintered body. The sintered body was cut to a size of 10 mm×2.5 mm and side surfaces were polished. A pair of external electrodes (first and second electrodes) that alternately short-circuit the internal electrodes were formed on the side surfaces by Au sputtering so as to prepare a multilayered piezoelectric element shown in FIG. 2B.

The internal electrodes of the multilayered piezoelectric element were observed. According to the observation, layers of the electrode material Ag—Pd were alternately stacked with layers of the piezoelectric material.

Prior to examining the properties of the multilayered piezoelectric element, each sample was subjected to a polarization treatment. In particular, the sample was heated to 100° C. to 150° C. on a hot plate, a voltage of 20 kV/cm was applied between the first and second electrodes for 30 minutes, and the sample was cooled to room temperature while applying the voltage.

The properties of the multilayered piezoelectric element obtained thereby were evaluated. The multilayered piezoelectric element had sufficient insulating properties and piezoelectric properties comparable to those of the piezoelectric material of Example 3 were obtained. The resistivity was about 400 GΩ·cm.

Comparative Example 8

The same raw material powders as those in Comparative Example 1 were wet-mixed at the same feed ratios as those of Example 3 and dried to remove water. The mixture was calcined at 1000° C. to 1100° C. to obtain a calcined mixture. An organic binder was added to the calcined mixture and mixing was performed. The resulting mixture was formed into sheets by a doctor blade method so as to obtain green sheets each having a thickness of 50 μm.

A conductive paste for forming internal electrodes was applied to each green sheet by printing. The conductive paste was a Ag 70%-Pd 30% alloy paste. Nine green sheets with the conductive paste applied thereto were stacked and the stack was fired at 1280° C. to prepare a sintered body. The sintered body was processed as in Example 20 to prepare a multilayered piezoelectric element shown in FIG. 2B.

The internal electrodes of the multilayered piezoelectric element were observed. The electrode material Ag—Pd was melted and Ag and Pd were diffused into the piezoelectric material layers. Moreover, the resistivity between the pair of external electrodes of the element was as low as $10^6$ Ω·cm or less and thus the piezoelectric constant could not be determined.

Comparative Example 9

Green sheets each having a thickness of 50 μm were obtained as in Comparative Example 8.

A conductive paste for forming internal electrodes was applied to each green sheet by printing. The conductive paste was a Ag 70%-Pd 30% alloy paste. Nine green sheets with the conductive paste applied thereto were stacked and the stack was fired at 1140° C. to prepare a sintered body. The sintered body was processed as in Example 20 to prepare a multilayered piezoelectric element shown in FIG. 2B.

The internal electrodes of the multilayered piezoelectric element were observed. According to the observation, layers of the electrode material Ag—Pd were alternately formed between the piezoelectric material layers but the sintering density of the piezoelectric material layers was insufficient. Thus, the resistivity between the pair of external electrodes of the element was as low as $10^8$ Ω·cm or less, the piezoelectric constant $d_{31}$ could not be detected, and the piezoelectric constant $d_{33}$ was smaller than 10 pC/N.

Example 21

A liquid discharge head shown in FIG. 3 was fabricated by using the piezoelectric element of Example 3. It was confirmed that the liquid discharge head discharged ink in response to an input electrical signal.

Example 22

A liquid discharge apparatus shown in FIG. 4 was fabricated by using the liquid discharge head of Example 21. It was confirmed that the liquid discharge apparatus discharged ink on a recording medium in response to an input electrical signal.

Example 23

An ultrasonic motor shown in FIG. 6A was fabricated by using the piezoelectric element of Example 3. It was confirmed that the ultrasonic motor rotated in response to application of alternating voltage.

Example 24

An optical apparatus shown in FIGS. 7A and 7B was fabricated by using the ultrasonic motor of Example 23. It was confirmed that automatic focusing operation was performed in response to application of alternating voltage.

Example 25

A dust removing device shown in FIGS. 9A and 9B was fabricated by using the piezoelectric element of Example 3. Plastic beads were scattered onto the apparatus and alternating voltage was applied to the apparatus. It was confirmed that the dust removing device exhibited good dust removing rate.

Example 26

An image-capturing apparatus shown in FIG. 12 was fabricated by using the dust removing device of Example 25. When the image-capturing apparatus was operated, dust on the surface of the image-capturing unit was satisfactorily removed and an image without defects caused by dust was obtained.

Example 27

A liquid discharge head shown in FIGS. 3A and 3B was fabricated by using the multilayered piezoelectric element of Example 20. It was confirmed that ink was discharged in response to an input electrical signal.

Example 28

A liquid discharge apparatus shown in FIG. 4 was fabricated by using the liquid discharge head of Example 27. It was confirmed that the liquid discharge apparatus discharged ink on a recording medium in response to an input electrical signal.

Example 29

An ultrasonic motor shown in FIG. 6B was fabricated by using the piezoelectric element of Example 20. It was confirmed that the ultrasonic motor rotated in response to application of alternating voltage.

Example 30

An optical apparatus shown in FIGS. 7A and 7B was fabricated by using the ultrasonic motor of Example 29. It was confirmed that automatic focusing operation was performed in response to application of alternating voltage.

Example 31

A dust removing device shown in FIGS. 9A and 9B was fabricated by using the piezoelectric element of Example 20. Plastic beads were scattered onto the apparatus and alternating voltage was applied to the apparatus. It was confirmed that the dust removing device exhibited good dust removing rate.

Example 32

An image-capturing apparatus shown in FIG. 12 was fabricated by using the dust removing device of Example 31. When the image-capturing apparatus was operated, dust on the surface of the image-capturing unit was satisfactorily removed and an image without defects caused by dust was obtained.

Example 33

An electronic apparatus shown in FIG. 14 was fabricated by using the multilayered piezoelectric element of Example 20. It was confirmed that the speaker was operated in response to application of alternating voltage.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-014612, filed Jan. 29, 2013, which is hereby incorporated by reference herein in its entirety.

INDUSTRIAL APPLICABILITY

Piezoelectric materials according to embodiments of the invention exhibit good piezoelectricity even in a high temperature environment. Since they do not contain lead, they have low impact on the environment. Accordingly, the piezoelectric materials can be used in appliances that use a large quantity of piezoelectric materials, such as liquid discharge heads, ultrasonic motors, and dust removing devices.

REFERENCE SIGNS LIST 1 first electrode
2 piezoelectric material
3 second electrode
101 piezoelectric element
102 individual liquid chamber
103 diaphragm
104 liquid chamber partition
105 discharge port
106 communication hole
107 common liquid chamber
108 buffer layer
1011 first electrode
1012 piezoelectric material
1013 second electrode
201 vibrator
202 rotor
203 output shaft
204 vibrator
205 rotor
206 spring
2011 elastic ring
2012 piezoelectric element
2013 organic adhesive
2041 metal elastic member
2042 multilayered piezoelectric element
310 dust removing device
320 diaphragm
330 piezoelectric element
331 piezoelectric material
332 first electrode
333 second electrode
336 first electrode surface
337 second electrode surface
310 dust removing device
320 diaphragm
330 piezoelectric element
51 first electrode
53 second electrode 54 piezoelectric material layer
55 internal electrode
56 stack
501 first electrode
503 second electrode
504 piezoelectric material layer
505a internal electrode
505b internal electrode
506a external electrode
506b external electrode
601 camera main body
602 mount
605 mirror box
606 main mirror
200 shutter unit
300 main body chassis
400 image-capturing unit
702 rear group lens (focus lens)
711 mount
712 fixed barrel
713 linear guide barrel
714 front lens group barrel
715 cam ring
716 rear group lens barrel
717 cam roller
718 shaft screw
719 roller
720 rotation transmitting ring
722 roller
724 manual focus ring
725 ultrasonic motor
726 wave washer
727 ball race
728 focus key
729 joint member
732 washer
733 low-friction sheet
881 liquid discharge apparatus
882 outer casing
883 outer casing
884 outer casing
885 outer casing
887 outer casing
890 recovery unit
891 recording unit
892 carriage
896 main unit
897 automatic feeder
898 discharge slot
899 transporting unit
901 optical device
908 release button
909 flash
912 speaker
914 microphone
916 auxiliary optical part
931 main body
932 zoom lever
933 power button

The invention claimed is:

1. A piezoelectric material comprising:
copper; and
a perovskite-type metal oxide represented by general formula (1)

$$(1-x)\{(Na_yBa_{1-y})(Nb_zTi_{1-z})O_3\}-xBiFeO_3 \text{(where } 0.001 \leq x \leq 0.015, 0.80 \leq y \leq 0.95, \text{ and } 0.85 \leq z \leq 0.95) \quad (1)$$

wherein 0.04 mol % or more and 2.00 mol % or less of Cu is contained relative to 1 mol of the perovskite-type metal oxide.

2. The piezoelectric material according to claim 1, wherein, in general formula (1), y<z.

3. The piezoelectric material according to claim 1, wherein the piezoelectric material has a Curie temperature of 120° C. or higher.

4. A piezoelectric element comprising:
a first electrode;
a piezoelectric material portion; and
a second electrode,
wherein the piezoelectric material portion includes the piezoelectric material according to claim 1.

5. A multilayered piezoelectric element comprising:
two or more piezoelectric material layers; and
one or more electrode layers that include one or more internal electrodes,
wherein the piezoelectric material layers and the electrode layers are alternately stacked and the piezoelectric material layers include the piezoelectric material according to claim 1.

6. The multilayered piezoelectric element according to claim 5, wherein the internal electrodes contain silver and palladium and a weight ratio M1/M2 satisfies $1.5 \leq M1/M2 \leq 9.0$ where M1 represents a content of silver in terms of weight and M2 represents a content of palladium in terms of weight.

7. The multilayered piezoelectric element according to claim 5, wherein the internal electrodes contain at least one selected from nickel and copper.

8. A liquid discharge head comprising:
a liquid chamber that includes a vibrating unit that includes the piezoelectric element according to claim 4; and
a discharge port communicating with the liquid chamber.

9. A liquid discharge apparatus comprising:
a stage configured to receive an object; and
the liquid discharge head according to claim 8.

10. An ultrasonic motor comprising:
a vibrating body that includes the piezoelectric element according to claim 4; and
a moving body configured to come into contact with the vibrating body.

11. An optical apparatus comprising:
a drive unit that includes the ultrasonic motor according to claim 10.

12. A vibrating apparatus comprising:
a vibrating body including a diaphragm and the piezoelectric element according to claim 4 disposed on the diaphragm.

13. A dust removing device comprising:
a vibrating unit that includes the vibrating apparatus according to claim 12.

14. An image-capturing apparatus comprising:
the dust removing device according to claim 13; and
an image-capturing element unit,
wherein the diaphragm of the dust removing device is disposed on a light-receiving-surface side of the image-capturing element unit.

15. An electronic apparatus comprising:
the piezoelectric element according to claim 4.

16. A liquid discharge head comprising:
a liquid chamber that includes a vibrating unit that includes the multilayered piezoelectric element according to claim 5; and
a discharge port communicating with the liquid chamber.

17. A liquid discharge apparatus comprising:
a stage configured to receive an object; and
the liquid discharge head according to claim 16.

18. An ultrasonic motor comprising:
a vibrating body that includes the multilayered piezoelectric element according to claim 5; and
a moving body configured to come into contact with the vibrating body.

19. An optical apparatus comprising:
a drive unit that includes the ultrasonic motor according to claim 18.

20. A vibrating apparatus comprising:
a vibrating body including a diaphragm and the multilayered piezoelectric element according to claim 5 disposed on the diaphragm.

21. A dust removing device comprising:
a vibrating unit that includes the vibrating apparatus according to claim 20.

22. An image-capturing apparatus comprising:
the dust removing device according to claim 21; and
an image-capturing element unit,
wherein the diaphragm of the dust removing device is disposed on a light-receiving-surface side of the image-capturing element unit.

23. An electronic apparatus comprising:
the multilayered piezoelectric element according to claim 5.

* * * * *